(12) United States Patent
Mariani et al.

(10) Patent No.: US 11,672,128 B2
(45) Date of Patent: Jun. 6, 2023

(54) METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

(71) Applicant: Micron Technology, Inc., Boise, ID (US)

(72) Inventors: Marcello Mariani, Milan (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 16/933,134

(22) Filed: Jul. 20, 2020

(65) Prior Publication Data
US 2022/0020756 A1   Jan. 20, 2022

(51) Int. Cl.
*H01L 27/11507* (2017.01)
*H01L 49/02* (2006.01)
*H01L 27/11504* (2017.01)
*H01L 23/60* (2006.01)

(52) U.S. Cl.
CPC ........ *H01L 27/11507* (2013.01); *H01L 23/60* (2013.01); *H01L 27/11504* (2013.01); *H01L 28/55* (2013.01); *H01L 28/60* (2013.01)

(58) Field of Classification Search
CPC .............. H01L 27/11507; H01L 23/60; H01L 27/11504; H01L 28/55; H01L 28/60; H01L 25/0652; H01L 25/16; H01L 25/18
See application file for complete search history.

(56) References Cited

U.S. PATENT DOCUMENTS

| | | | |
|---|---|---|---|
| 8,344,517 B2 * | 1/2013 | Kim | H01L 21/7682 438/619 |
| 9,608,077 B1 | 3/2017 | Kye | |
| 10,062,745 B2 | 8/2018 | Ramaswamy | |
| 10,388,658 B1 | 8/2019 | Ramaswamy | |
| 10,622,366 B2 | 4/2020 | Chavan et al. | |

(Continued)

FOREIGN PATENT DOCUMENTS

| | | |
|---|---|---|
| JP | 2009-010424 | 1/2009 |
| TW | I645539 | 12/2018 |

(Continued)

OTHER PUBLICATIONS

KR KR2017-0028666 Abst—FullRef, Mar. 14, 2014, SK Hynix Inc.

(Continued)

*Primary Examiner* — David Vu
(74) *Attorney, Agent, or Firm* — Wells St. John P.S.

(57) ABSTRACT

Some embodiments include an integrated assembly having a row of conductive posts. The conductive posts are spaced from one another by gaps. Leaker device material extends is within at least some of the gaps. An insulative material is along sidewalls of the conductive posts. A conductive structure is over the conductive posts. The conductive structure has downward projections extending into at least some of the gaps. The leaker device material is configured as segments along sides of the downward projections and extends from the sides to one or more of the conductive posts. Some embodiments include methods of forming integrated assemblies.

40 Claims, 28 Drawing Sheets

(56) References Cited

U.S. PATENT DOCUMENTS

| | | |
|---|---|---|
| 11,127,744 B2 | 9/2021 | Servalli et al. |
| 11,170,834 B2 | 11/2021 | Mutch et al. |
| 2006/0054958 A1 | 3/2006 | Weis et al. |
| 2006/0113587 A1 | 6/2006 | Thies et al. |
| 2007/0228434 A1 | 10/2007 | Shimojo |
| 2008/0035958 A1 | 2/2008 | Asao |
| 2008/0093644 A1 | 4/2008 | Forbes |
| 2008/0296671 A1 | 12/2008 | Takaishi |
| 2009/0242972 A1 | 10/2009 | Cho |
| 2010/0052029 A1 | 3/2010 | Huang |
| 2012/0153371 A1 | 6/2012 | Chen et al. |
| 2012/0241826 A1 | 9/2012 | Satoh et al. |
| 2013/0302966 A1 | 11/2013 | Oh et al. |
| 2015/0041873 A1 | 2/2015 | Karda et al. |
| 2015/0123067 A1 | 5/2015 | Lee |
| 2015/0171143 A1 | 6/2015 | Park |
| 2015/0214278 A1 | 6/2015 | Satoh et al. |
| 2016/0020251 A1 | 1/2016 | Kim et al. |
| 2016/0049397 A1 | 2/2016 | Chang et al. |
| 2017/0236828 A1 | 8/2017 | Karda |
| 2017/0309322 A1 | 10/2017 | Ramaswamy |
| 2018/0122816 A1 | 5/2018 | Ramaswamy |
| 2018/0197864 A1 | 7/2018 | Sills |
| 2018/0197870 A1 | 7/2018 | Balakrishnan |
| 2019/0074363 A1 | 3/2019 | Zhu |
| 2019/0148390 A1 | 5/2019 | Frank |
| 2019/0189357 A1 | 6/2019 | Chavan |
| 2019/0333917 A1 | 10/2019 | Ramaswamy |
| 2020/0111800 A1 | 4/2020 | Ramaswamy |
| 2020/0203357 A1 | 6/2020 | Chhajed et al. |
| 2020/0243267 A1 | 7/2020 | Chavan et al. |
| 2020/0381290 A1 | 12/2020 | Ramaswamy |
| 2020/0388619 A1 | 12/2020 | Sukekawa et al. |
| 2020/0395437 A1 | 12/2020 | Ramaswamy |
| 2021/0134816 A1 | 5/2021 | Calderoni et al. |
| 2021/0183873 A1 | 6/2021 | Goodwin et al. |

FOREIGN PATENT DOCUMENTS

| | | |
|---|---|---|
| TW | I671884 | 9/2019 |
| TW | 202025400 A | 1/2020 |
| TW | I715007 | 1/2021 |
| WO | WO 2021/006989 | 1/2021 |
| WO | WO PCT/US2020/066285 | 4/2021 |
| WO | WO PCT/US2022/015936 | 5/2022 |
| WO | WO PCT/US2020/066285 | 7/2022 |
| WO | WO PCT/US2022/033900 | 10/2022 |
| WO | WO PCT/US2022/037148 | 11/2022 |
| WO | WO PCT/US2022/036917 | 1/2023 |

OTHER PUBLICATIONS

WO PCT-US2021-040018 Srch Rpt, Oct. 21, 2021, Micron Technology, Inc.
WO PCT-US2021-040018 Wtn Opn, Oct. 21, 2021, Micron Technology, Inc.
Mariani et al., U.S. Appl. No. 17/371,506, filed Jul. 9, 2021, titled "Integrated Assemblies and Methods of Forming Integrated Assemblies", 38 pages.
Ramaswamy et al., U.S. Appl. No. 17/381,040, filed Jul. 20, 2021, titled "Integrated Assemblies and Methods of Forming Integrated Assemblies", 39 pages.
Servalli et al., U.S. Appl. No. 17/379,012, filed Jul. 19, 2021, titled "Integrated Assemblies and Methods of Forming Integrated Assemblies", 36 pages.
Servalli et al., U.S. Patent Serial U.S. Appl. No. 17/189,594, filed Mar. 2, 2021, titled "Memory Devices and Methods of Forming Memory Devices", 35 pages.

* cited by examiner

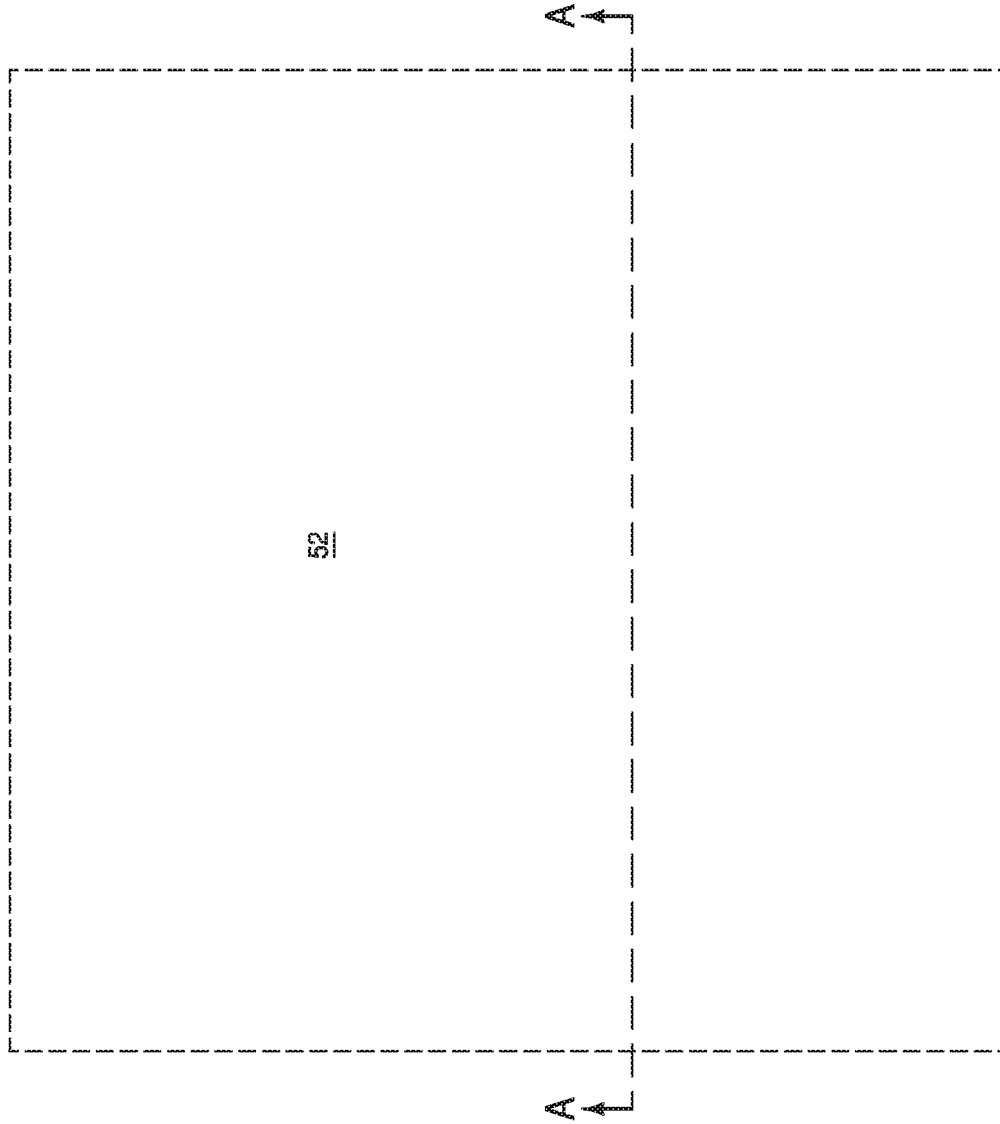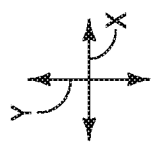

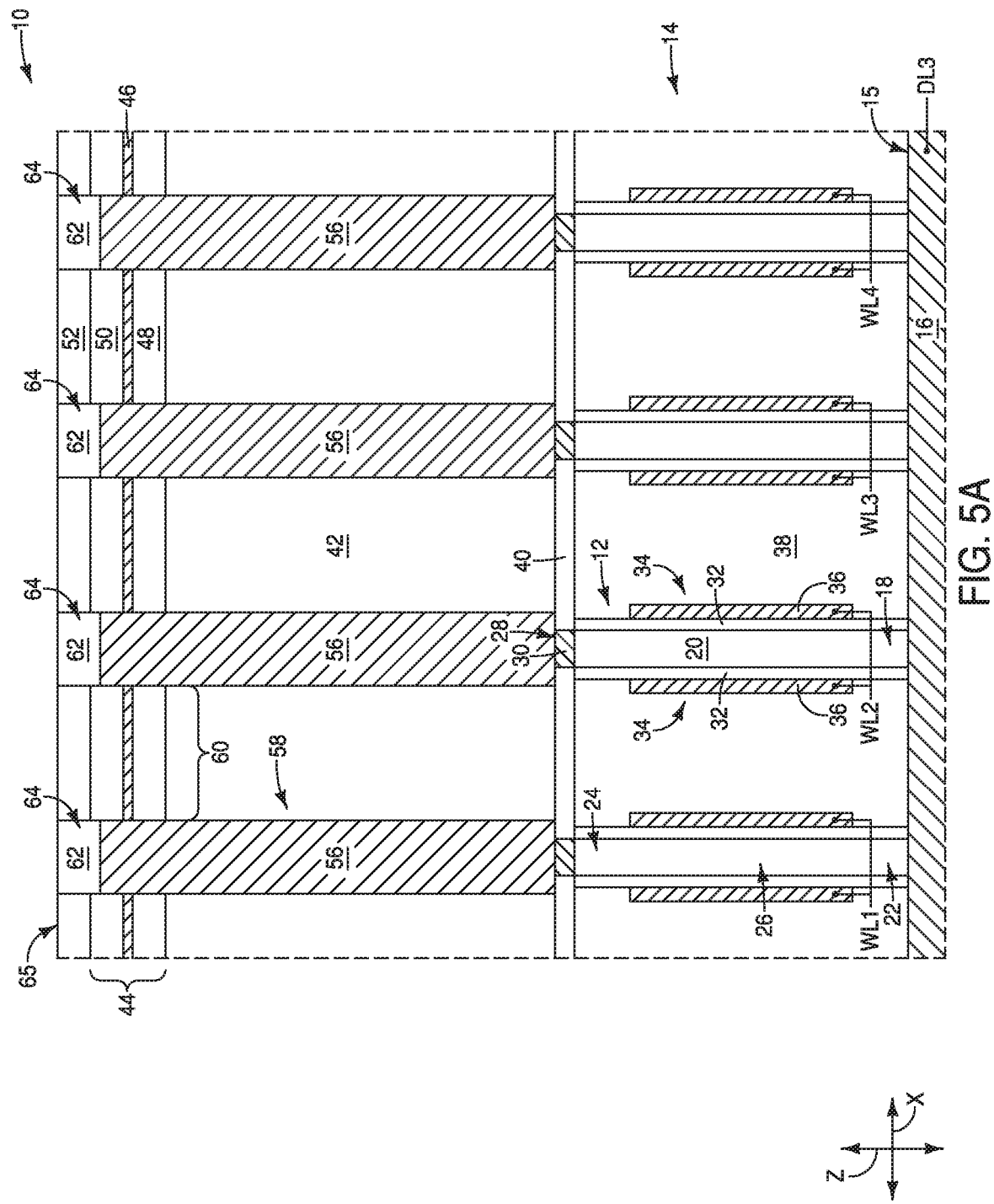

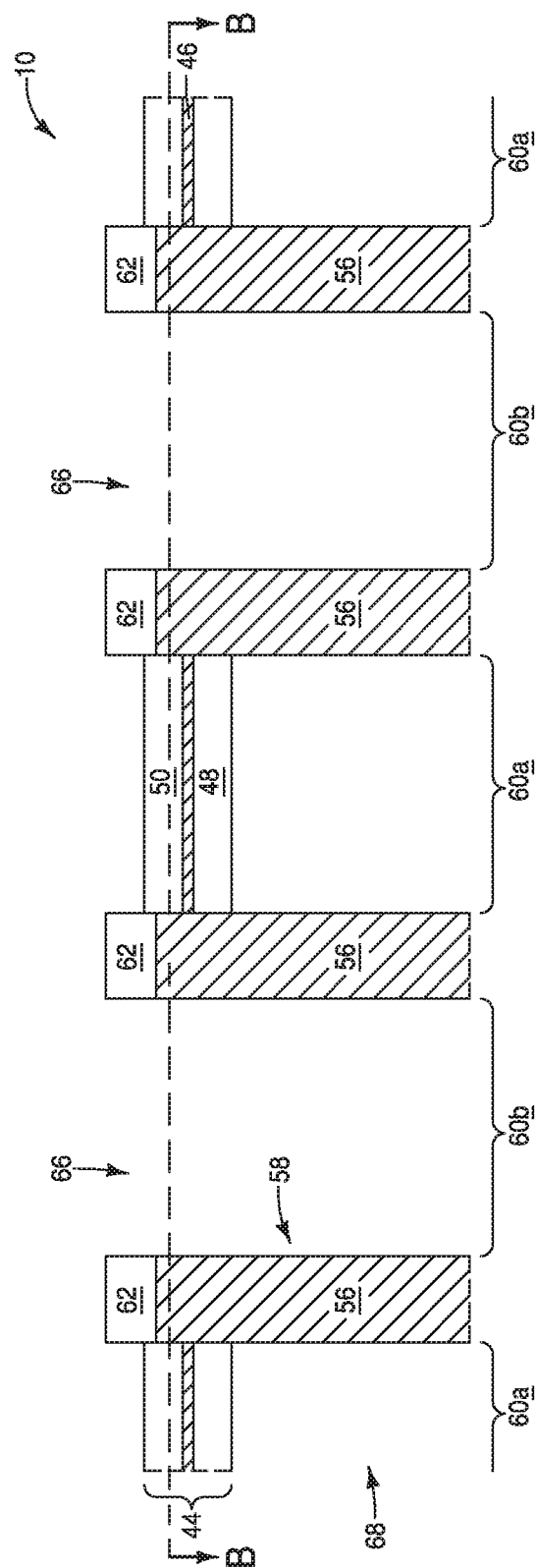

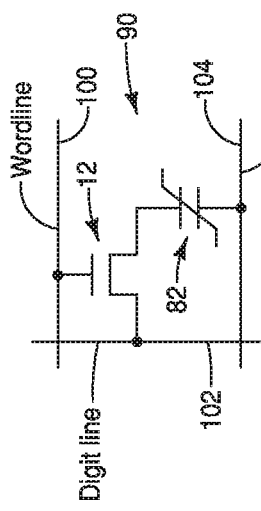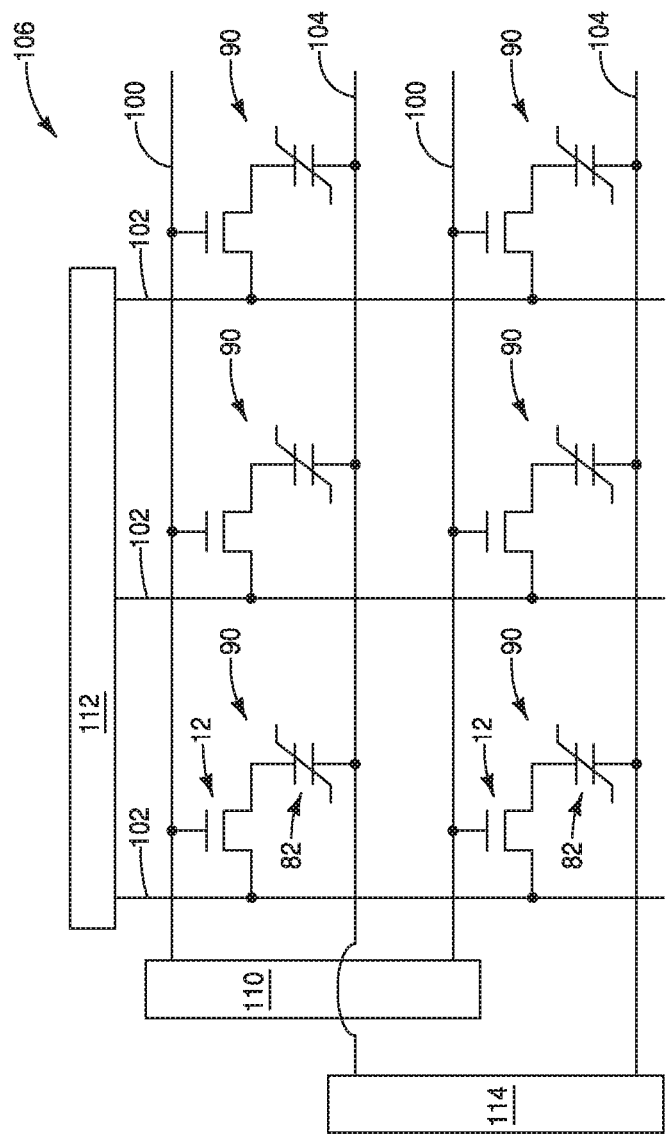
FIG. 17
FIG. 18

METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

TECHNICAL FIELD

Integrated assemblies (e.g., integrated memory). Methods of incorporating leaker devices into capacitor configurations to reduce cell disturb. Capacitor configurations incorporating leaker devices. Memory arrays comprising leaker devices.

BACKGROUND

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within (through) dielectric material of memory cells can be problematic for at least the reasons that such may make it difficult to reliability store data, and may otherwise waste power. Leakage may be become increasingly difficult to control as circuitry is scaled to increasingly smaller dimensions.

It would be desirable to develop architectures which alleviate, or even prevent, undesired leakage; and to develop methods for fabricating such architectures.

BRIEF DESCRIPTION OF THE DRAWINGS

FIG. 1 is a top-down view, and FIG. 1A is a cross-sectional side view along the line A-A of FIG. 1.

FIGS. 2 and 2A are diagrammatic views of the region of FIGS. 1 and 1A at an example process stage following that of FIGS. 1 and 1A. FIG. 2 is a top-down view, and FIG. 2A is a cross-sectional side view along the line A-A of FIG. 2.

FIG. 3 is a top-down view, and FIG. 3A is a cross-sectional side view along the line A-A of FIG. 3.

FIG. 4 is a top-down view, and FIG. 4A is a cross-sectional side view along the line A-A of FIG. 4.

FIGS. 5 and 5A are diagrammatic views of the region of FIGS. 1 and 1A at an example process stage following that of FIGS. 4 and 4A. FIG. 5 is a top-down view, and FIG. 5A is a cross-sectional side view along the line A-A of FIG. 5.

FIG. 6 is a top-down view along the line B-B of FIG. 6A, and FIG. 6A is a cross-sectional side view along the line A-A of FIG. 6.

FIGS. 7-7B are diagrammatic views of the region of FIGS. 1 and 1A at an example process stage following that of FIGS. 6 and 6A. FIG. 7 is a top-down view along the line B-B of FIGS. 7A and 7B, FIG. 7B is a cross-sectional side view along the line C-C of FIG. 7. The bottom of FIG. 7B is truncated at a higher location than the bottom of FIG. 7A.

FIG. 8 is a top-down view along the line B-B of FIG. 8A, and FIG. 8A is a cross-sectional side view along the line A-A of FIG. 8.

FIG. 9 is a top-down view along the line B-B of FIG. 9A, and FIG. 9A is a cross-sectional side view along the line A-A of FIG. 9.

FIG. 14 is a top-down view along the line B-B of FIG. 14A, and FIG. 14A is a cross-sectional side view along the line A-A of FIG. 14.

FIG. 17 is a diagrammatic schematic view of an example memory cell.

FIG. 18 is a diagrammatic schematic view of a region of an example memory array.

DETAILED DESCRIPTION OF THE ILLUSTRATED EMBODIMENTS

Some embodiments include utilization of leaker devices to reduce charge buildup along bottom electrodes of capacitors. The leaker devices may couple the bottom electrodes to conductive plates. The conductive plates may be along top electrodes of the capacitors, and may be utilized to electrically couple the top electrodes to one another. The leaker devices may have conductivity (or alternatively, resistance) tailored to enable excess charge to drain from the bottom electrodes to the conductive plate, while not enabling problematic shorting between the bottom electrodes and the conductive plate. The leaker devices may thus be configured to enable discharge from the bottom electrodes in the event of undesired charge buildup. The discharge may be considered to be leakage of excess charge, and thus the devices enabling such discharge may be referred to as leaker devices. The leakage of excess charge from the bottom electrodes is one type of leakage referred to herein. Another, and very different, form of leakage is the problematic leakage of charge through capacitor insulative material (dielectric material), which is referred to in the Background section, and which can lead to data loss from memory devices comprising the capacitor insulative material. Some applications may utilize the leaker devices to enable discharge of excess charge from bottom electrodes, and to thereby alleviate (or even prevent) conditions which may lead to the problematic leakage of charge through capacitor insulative material.

Many, if not most, primary memory cell disturb mechanisms are due to a buildup of potential at cell bottom (CB) electrical nodes. This disturb mechanism may be particularly applicable for ferroelectric RAM (FERAM). However, other types of electronic devices may benefit from the subject matter provided herein as well. The buildup of potential at CB electrical nodes may lead to undesired leakage through insulative material of a memory cell.

In some embodiments, each of the memory cells in a memory array may be programmed to one of two data states to represent a binary value of "0" or "1" in a single bit. Such a cell is sometimes called a single-level cell (SLC). Various operations on these types of cells are independently known in the semiconductor and related arts.

Regardless of the memory cell arrangement, the primary disturb mechanisms discussed above can arise due to different factors. For example, charge on the cell bottom-node can rise due to factors such as plate glitch, access transistor leakage, cell-to-cell interactions, and/or other factors. If an insulative material in a memory cell leaks significantly, the state of the cell may be adversely affected.

In various embodiments described herein, leaker devices are introduced into a memory array to prevent build-up of potential at bottom nodes of capacitors associated with individual memory cells. Example embodiments are described with reference to FIGS. 1-18.

Figure 1:
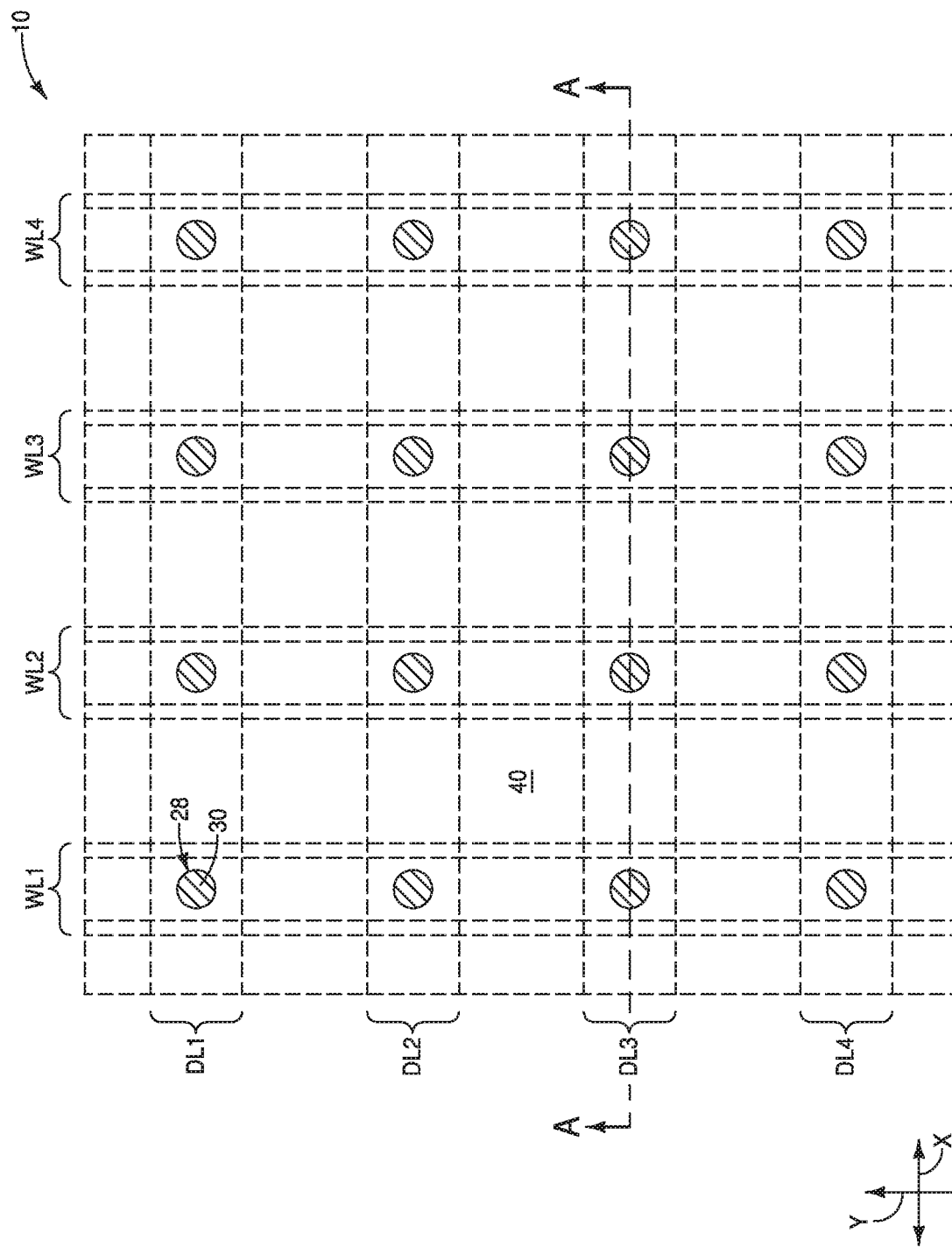
FIGS. 1 and 1A are diagrammatic views of a region of an example assembly at an example process stage of an example method.
Figure 1A:
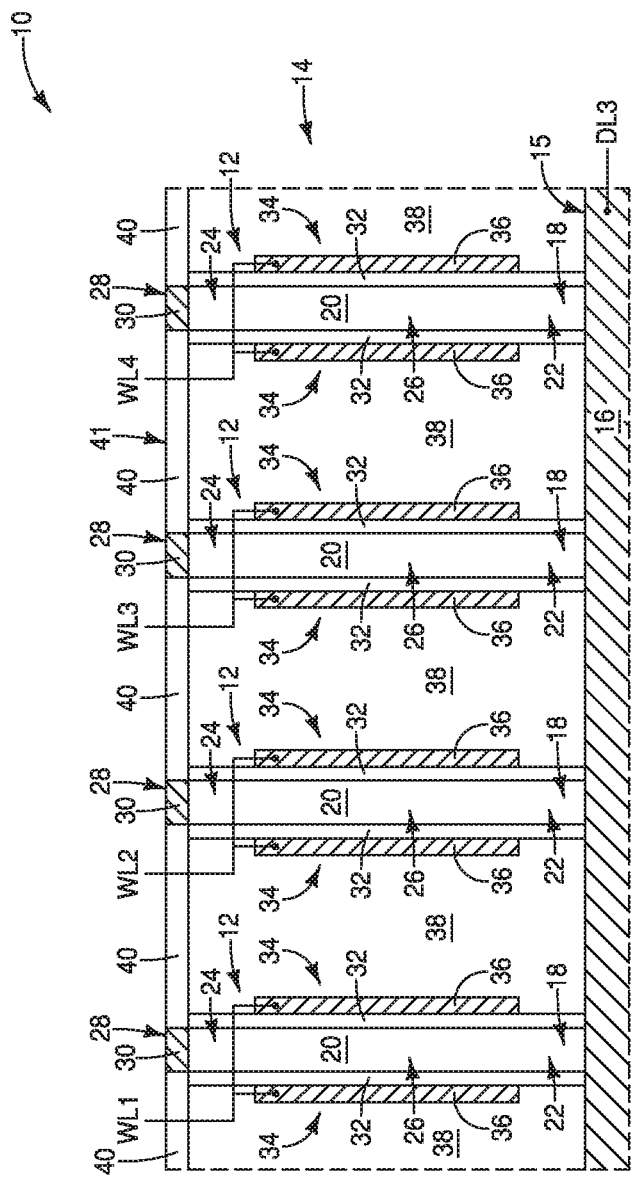

Referring to FIGS. 1 and 1A, an assembly (apparatus) 10 comprises a plurality of access devices 12 arranged within an array 14. Digit lines (DL1-DL4) extend across the array along a first direction (illustrated as an x-axis direction), and wordlines (WL1-WL4) extend along a second direction (illustrated as a y-axis direction). In some embodiments, one of the first and second directions may be referred to as a row direction and the other may be referred to as a column direction. For instance, in some embodiments the wordlines may be considered to extend along a row direction, while the digit lines are considered to extend along a column direction. The wordlines and digit lines are shown in dashed-line (phantom) view in FIG. 1 to indicate that they are beneath other materials.

FIG. 1A shows the access devices 12 configured as vertically-extending access transistors. In the illustrated embodiment, the transistors 12 extend along in illustrated z-axis, which is shown to be orthogonal to the x-axis. In some embodiments, the transistors 12 may extend substantially vertically, with the term "substantially vertical" meaning vertical to within reasonable tolerances of fabrication and measurement. In some embodiments, the digit line DL3 of FIG. 1A may be considered to have a horizontally-extending top surface 15, and the access transistors 12 may be considered to extend about vertically, with the term "about vertical" meaning orthogonal to the horizontally-extending surface 15 to within about ±15°.

The cross-section of FIG. 1A shows the example digit line (DL3) comprising conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit lines may be supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The access transistors 12 comprise vertically-extending pillars 18 of semiconductor material 20. The semiconductor material 20 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 20 may comprise silicon.

The pillars 18 include source/drain regions 22 and 24, and channel regions 26 between the source/drain regions. The lower source/drain regions 22 are electrically coupled with digit lines (e.g., DL3). The upper source/drain regions 24 are electrically coupled with conductive contacts (interconnects) 28. The contacts 28 comprise conductive material 30. The conductive material 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 30 may comprise metal over metal silicide. For instance, the conductive material 30 may comprise tungsten over tungsten silicide. As another example, the conductive material 30 may comprise tungsten over tungsten nitride, which in turn is over tungsten silicide.

The access transistors 12 include insulative material 32 along sidewalls of the pillars 18. The insulative material 32 may be referred to as gate dielectric material, and may comprise any suitable composition(s). In some embodiments, the insulative material 32 may comprise silicon dioxide.

The wordlines WL1-WL4 include gate regions 34 adjacent the channel regions 26. In operation, electrical activation/deactivation of the wordlines may selectively induce electric fields along the channel regions 26 to controllably couple/decouple the source/drain regions 22 and 24 from one another along individual access devices 12. Such controllable coupling/decoupling of the source/drain regions may be referred to as gated coupling of the source/drain regions.

The wordlines WL1-WL4 comprise conductive material 36. The conductive material 36 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

An insulative material 38 is provided between the access devices 12. The insulative material 38 may comprise any suitable composition(s), and in some embodiments may comprise silicon dioxide. The insulative material 38 may be referred to as a first insulative material.

An insulative material 40 is over the insulative material 38. The insulative material 40 may comprise any suitable composition(s), and in some embodiments may comprise silicon nitride. The insulative material 40 may be referred to as a second insulative material.

The illustrated access devices 12 are examples of access devices that may be utilized in some example embodiments. In other embodiments, other types of access devices may be utilized.

In the shown embodiment, a planarized surface 41 extends across the insulative material 40 and the conductive material 30. The planarized surface 41 may be formed with any suitable processing, including, for example, chemical-mechanical polishing (CMP). In other embodiments, the surface 41 may have other configurations besides the illustrated planarized configuration.

In the illustrated embodiment, the conductive interconnects 28 are circular in top-down view (as shown in FIG. 1). In other embodiments, the conductive interconnects 28 may have other suitable shapes (e.g., square, elliptical, rectangular, other polygonal, etc.).

Figure 2A:
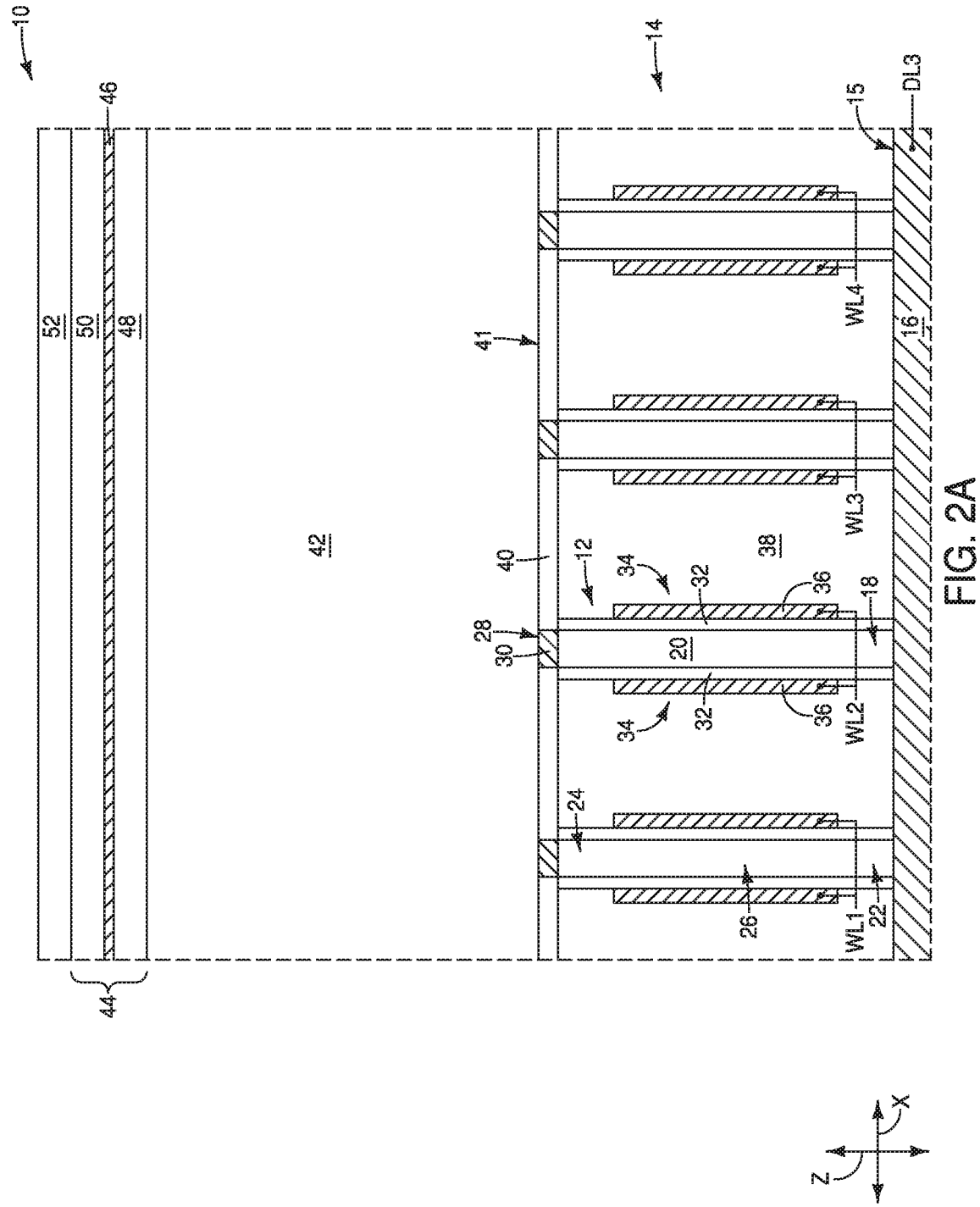

Referring to FIGS. 2 and 2A, an insulative material 42 is formed over the surface 41. The insulative material 42 may comprise any suitable composition(s), and in some embodiments may comprise, consist essentially of, or consist of silicon dioxide. Although the material 42 is shown to be homogeneous, in other embodiments the material 42 may comprise a laminate of two or more different compositions. For instance, in some embodiments one or more insulative layers may be formed over the surface 41, and then the bulk of the material 42 may be formed over such insulative layers.

A stack 44 is formed over the insulative material 42. The stack includes a leaker device material 46 vertically sandwiched between a lower dielectric (insulative) material 48 and an upper dielectric (insulative) material 50. The upper and lower dielectric materials 48 and 50 may comprise a same composition as one another, or may comprise different compositions relative to one another. In some embodiments, the upper and lower dielectric materials 48 and 50 may both comprise, consist essentially of, or consist of silicon nitride.

The leaker device material 46 may comprise any suitable composition or combination of compositions. In some embodiments, the leaker device material 46 may comprise, consist essentially of, or consist of one or more of titanium, nickel and niobium in combination with one or more of germanium, silicon, oxygen, nitrogen and carbon. In some embodiments, the leaker device material may comprise, consist essentially of, or consist of one or more of Si, Ge, SiN, TiSiN, TiO, TiN, NiO, NiON and TiON; where the chemical formulas indicate primary constituents rather than particular stoichiometries. In some embodiments, the leaker device material may comprise, consist essentially of, or consist of titanium, oxygen and nitrogen. In some embodiments, the leaker device material may comprise amorphous silicon, niobium monoxide, silicon-rich silicon nitride, etc., either alone or in any suitable combination.

In some embodiments, the leaker device material 46 may be a continuous layer having a thickness within a range of from about 2 angstroms (Å) to about 20 Å. In some embodiments, the leaker device material may be a continuous layer having a thickness within a range of from about 6 Å to about 15 Å.

Insulative material 52 is formed over the stack 44. The insulative material 52 may comprise any suitable composition(s), and in some embodiments may comprise silicon dioxide.

Figure 3:
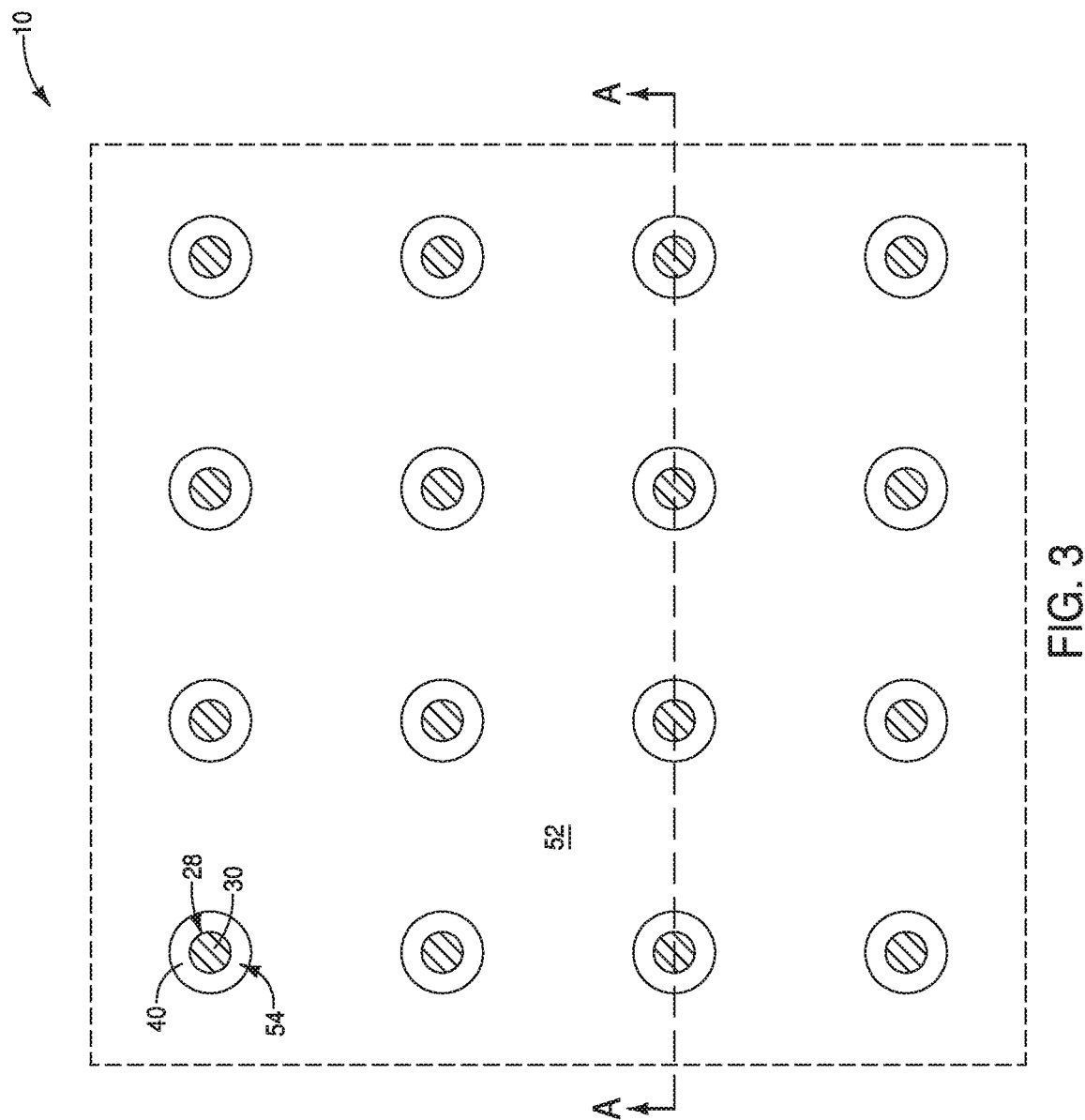
FIGS. 3 and 3A are diagrammatic views of the region of FIGS. 1 and 1A at an example process stage following that of FIGS. 2 and 2A.
Figure 3:
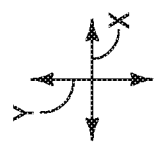
Figure 3A:
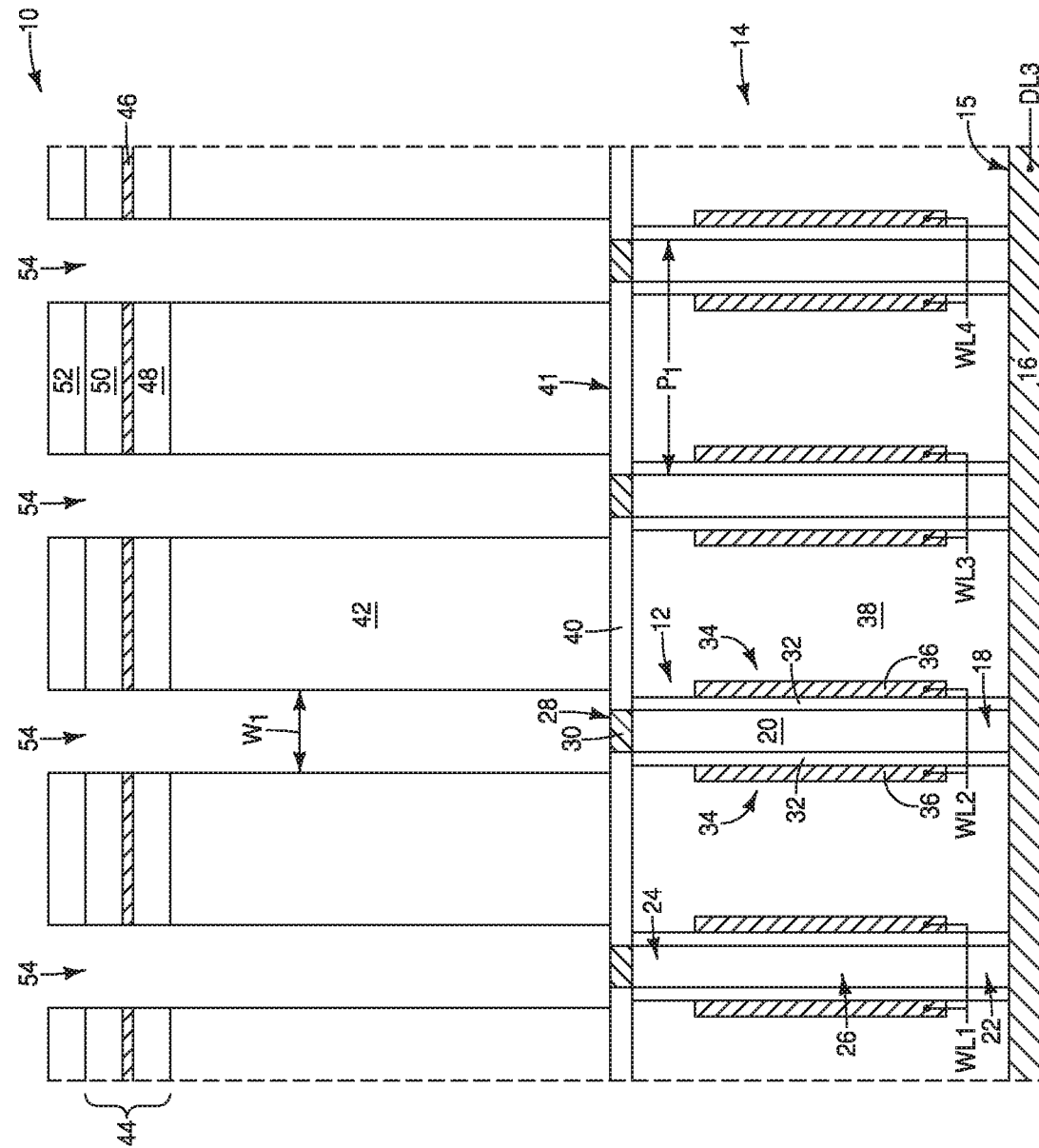

Referring to FIGS. 3 and 3A, openings 54 are formed to extend through the materials 42, 46, 48, 50 and 52, and to the upper surface 41. The openings may be patterned with any suitable methodology. For instance, a patterned mask (not shown) may be provided over the surface 52 and utilized to define locations of the openings 54, then the openings 54 may be formed with one or more suitable etches, and then the mask may be removed to leave the configuration of FIGS. 3 and 3A. The openings 54 may have any suitable dimensions. In some embodiments, the access devices 12 may be formed on a pitch $P_1$ which is within a range of from about 20 nanometers (nm) to about 60 nm, and the openings 54 may have widths $W_1$ within a range of from about 10 nm to about 20 nm.

The openings 54 are aligned with the interconnects 28 so that each of the openings exposes one of the interconnects.

In the illustrated embodiment, the openings 54 are circular in top-down view (as shown in FIG. 3). In other embodiments, the openings 54 may have other suitable shapes (e.g., square, elliptical, rectangular, other polygonal, etc.).

Figure 4:
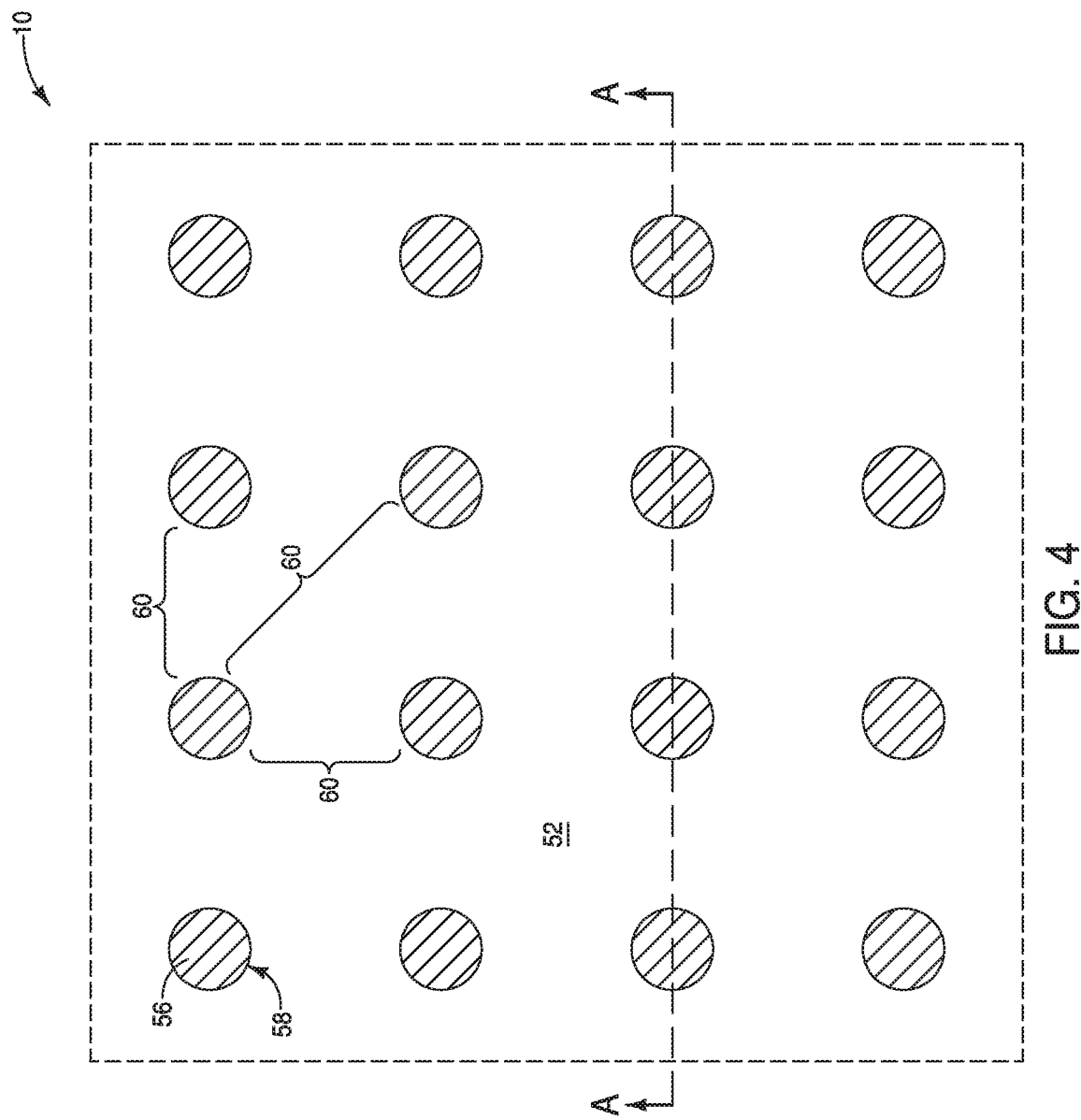
FIGS. 4 and 4A are diagrammatic views of the region of FIGS. 1 and 1A at an example process stage following that of FIGS. 3 and 3A.
Figure 4:
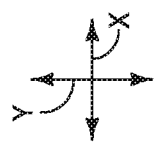
Figure 4A:
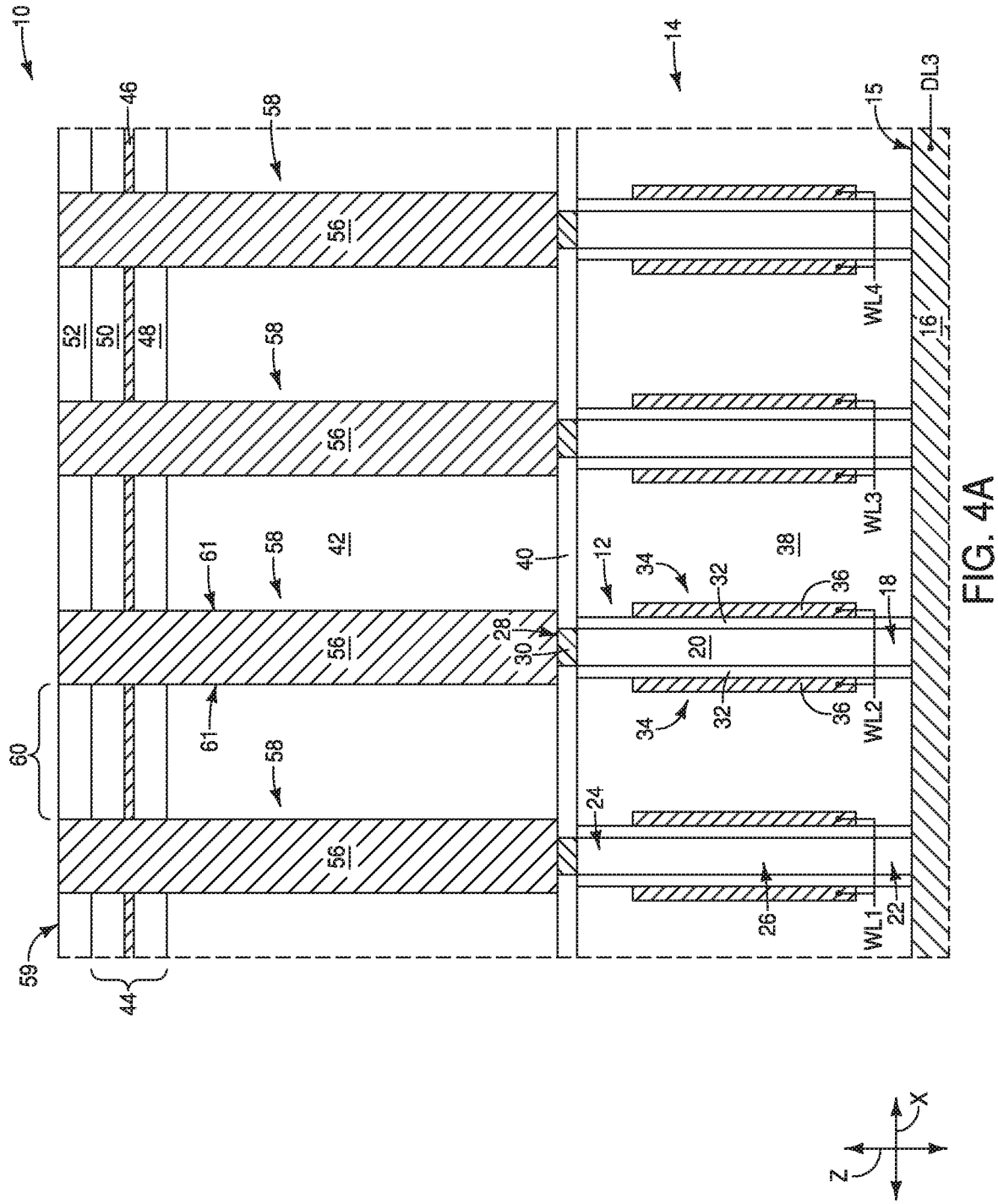

Referring to FIGS. 4 and 4A, conductive material 56 is formed within the openings 54 (FIGS. 3 and 3A). The conductive material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 56 may comprise metal (e.g., tungsten, titanium, tungsten silicide, titanium silicide, tungsten nitride, titanium nitride, etc.).

The conductive material 56 is configured as conductive posts 58. Each of the conductive posts is coupled with one of the access devices 12, and in the shown embodiment is directly against one of the conductive interconnects 28. In the illustrated embodiment, the access devices are under the conductive posts, and are vertically-aligned with the conductive posts.

The conductive posts 58 may be patterned by forming the conductive material 56 within the openings 54 (FIGS. 3 and 3A), and over the material 52. Subsequently, excess conductive material 56 may be removed with a planarization process (e.g., CMP) to pattern the posts 58, and to form the illustrated planarized surface 59 extending across the posts 58 and across the insulative material 52.

The conductive posts 58 are spaced from one another by gaps 60. The leaker material 46 is within the gaps, and directly contacts sidewalls 61 of the conductive posts 58.

The conductive posts 58 eventually become electrodes of capacitors. Accordingly, the posts 58 may be referred to as first electrode structures, or as lower electrode structures.

Figure 5:
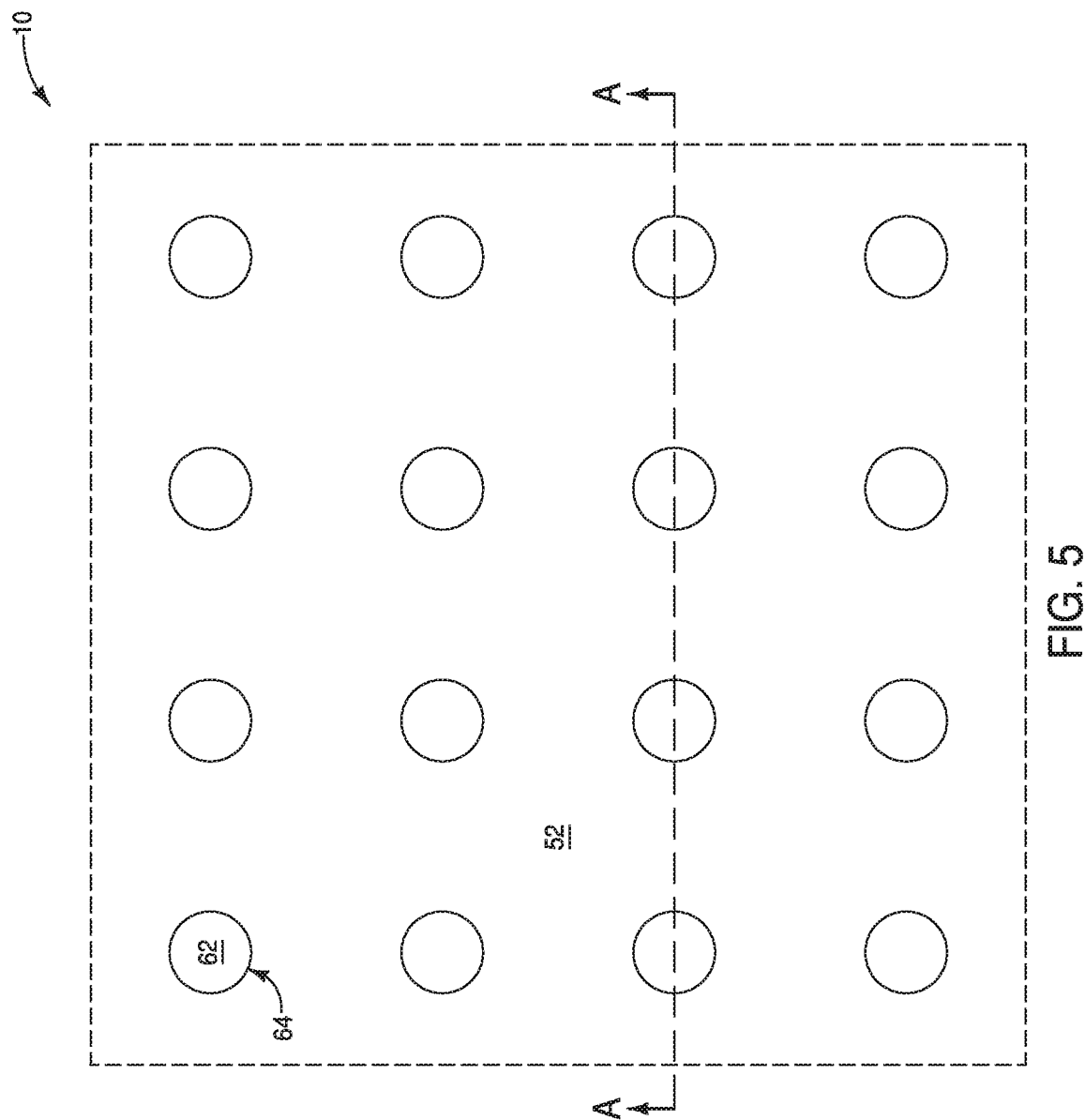

Referring to FIGS. 5 and 5A, the conductive material 56 of the posts 58 is recessed, and then insulative material 62 is formed over the posts and patterned into insulative plugs 64. A planarized surface 65 is formed across the insulative material 52 and the insulative plugs (caps) 64. The planarized surface may be formed with any suitable processing, such as, for example, CMP.

The insulative material 62 may comprise any suitable composition(s), such as, for example, carbon, undoped silicon, fluorosilicate glass, borophosphosilicate glass, boron-doped silicon dioxide, carbon-doped silicon dioxide, etc. The term "undoped silicon" refers to silicon which is not conductively doped. The undoped silicon may have a small amount of dopant therein (e.g., an intrinsic concentration of dopant), but lacks a sufficient dopant concentration to be electrically conductive.

Figure 6:
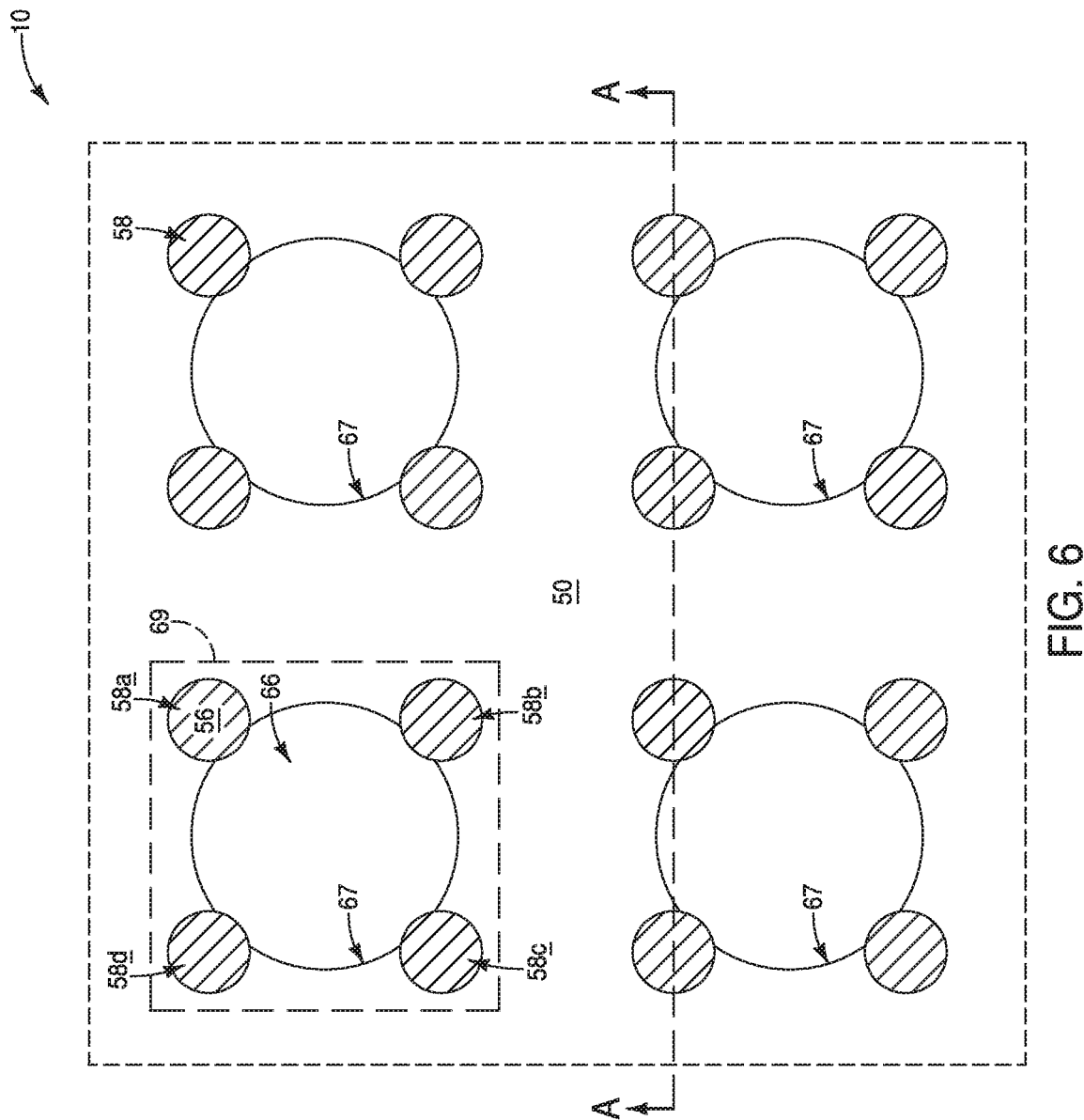
FIGS. 6 and 6A are diagrammatic views of the region of FIGS. 1 and 1A at an example process stage following that of FIGS. 5 and 5A.
Figure 6A:
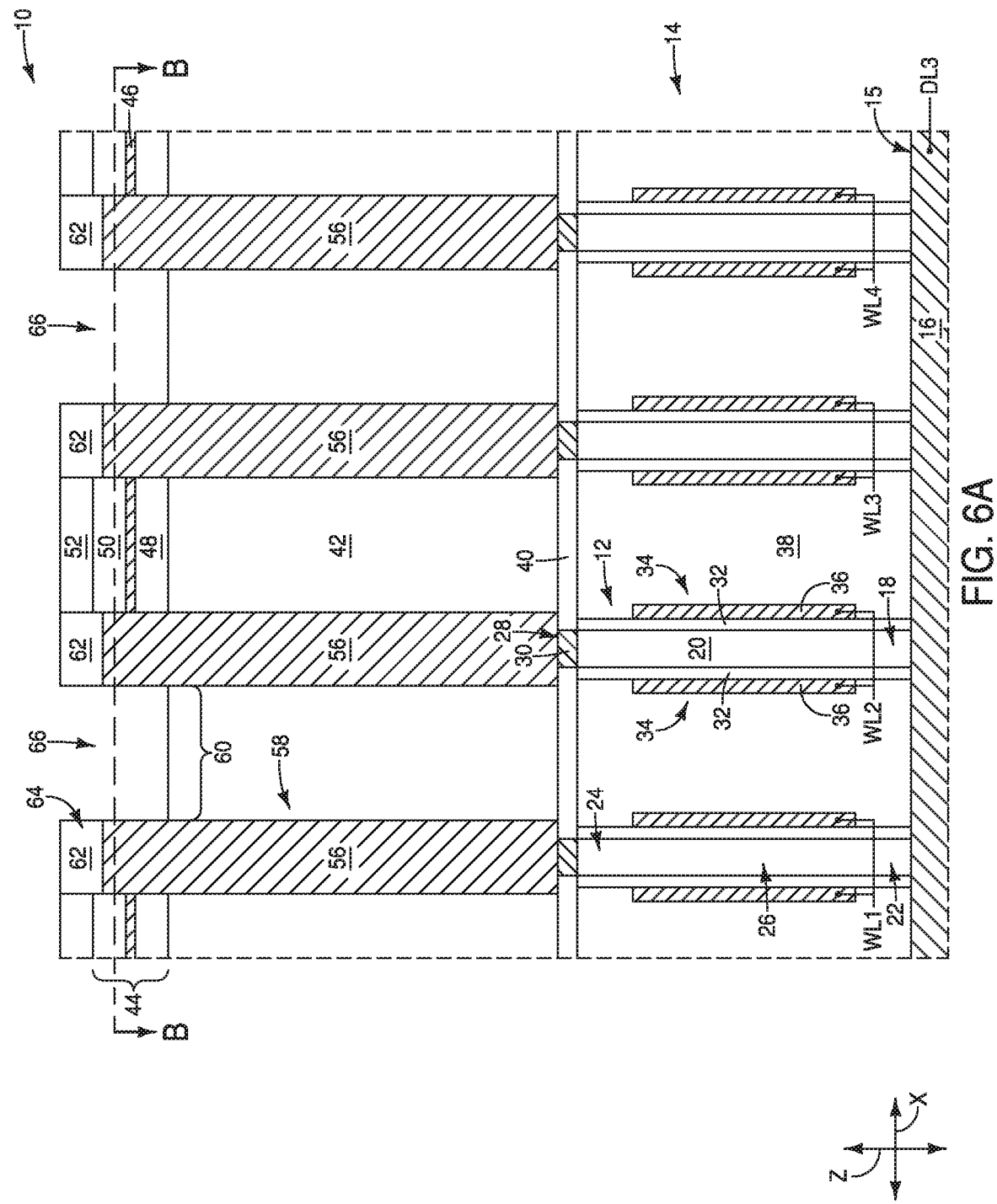

Referring to FIGS. 6 and 6A, segments of the stack 44 and insulative material 52 are removed to form openings 66. In some embodiments, the posts 58 may be considered to be subdivided among sets of four, and the openings 66 may be considered to be centrally located relative to each of the sets of four posts. One of the sets of four posts is diagrammatically illustrated as being within an area identified with a dashed-line box 69. The four posts within the box 69 are indicated to be a first post 58a, a second post 58b, a third post 58c and a fourth post 58d.

It is noted that the views of FIGS. 1-5 are top views, whereas the view of FIG. 6 is along the cross-section B-B of FIG. 6A rather than being a top view.

It is also noted that the processing of FIGS. 6 and 6A exposes regions of the leaker device material 46 to subsequent processing which may damage such regions. However, the exposed regions are along the lateral edges 67 of the openings 66 (as shown in the top-down view of FIG. 6), and accordingly subsequent damage of such regions does not adversely impact regions of the leaker device material ultimately utilized for incorporation into functional segments of leaker devices.

Figure 7:
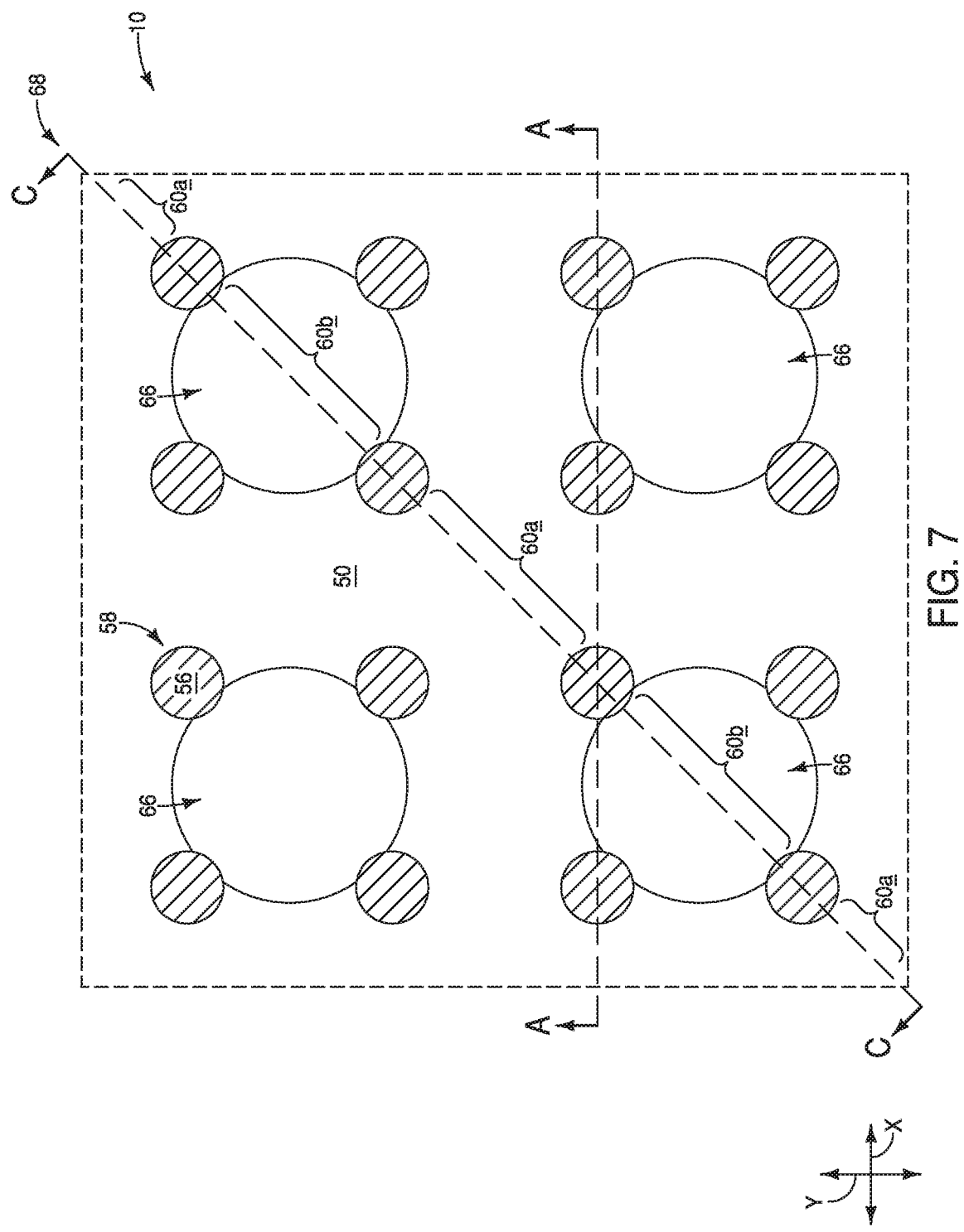

Referring to FIGS. 7-7B, the insulative materials 42 and 52 (FIGS. 6 and 6A) are removed. In some embodiments, the insulative materials 42 and 52 comprise silicon dioxide, and are removed with a wet etch utilizing hydrofluoric acid.

Figure 7A:
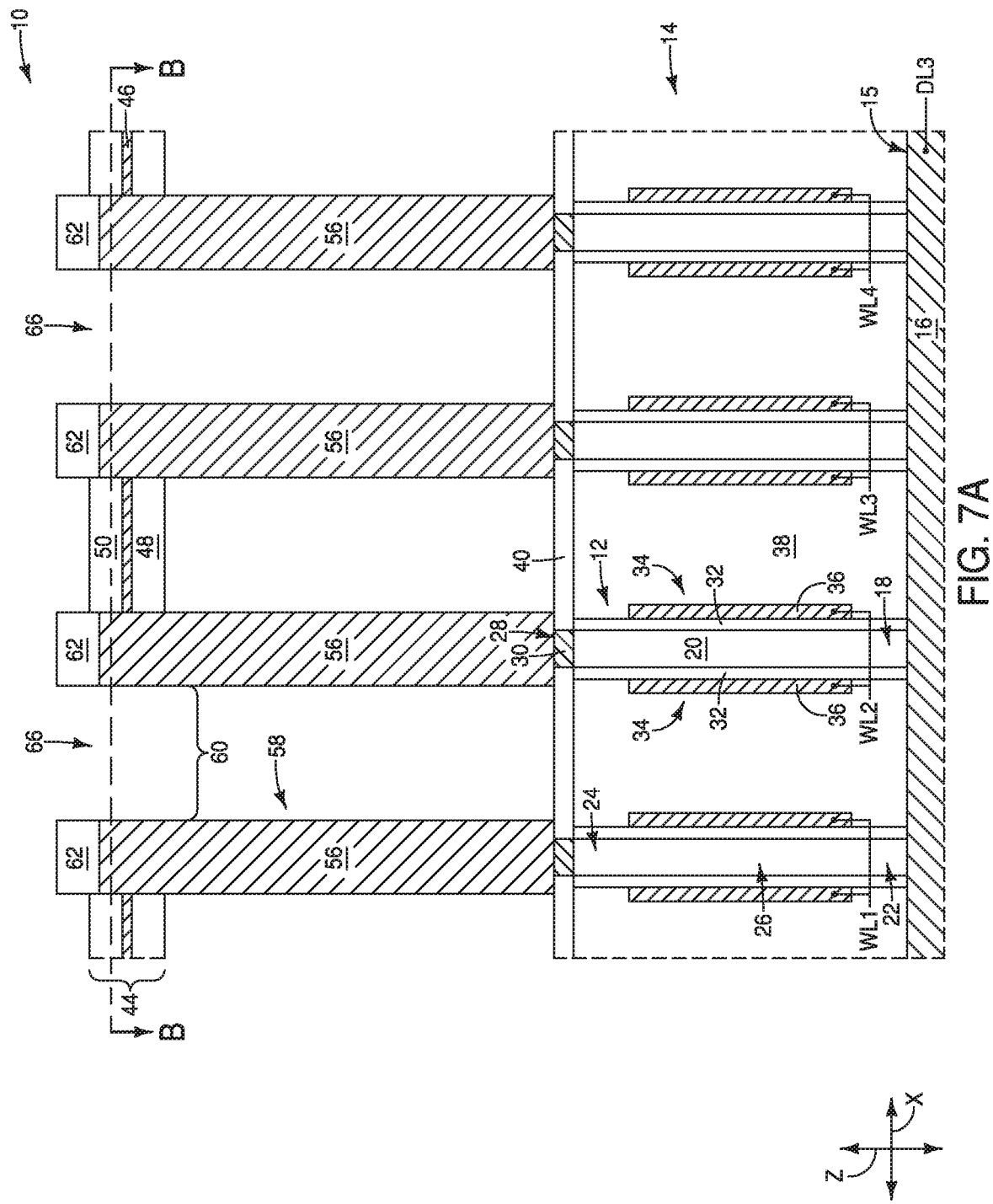
FIG. 7A is a cross-sectional side view along the line A-A of FIG. 7

FIG. 7A shows the assembly 10 along the same cross-section as FIG. 6A, and FIG. 7B shows the assembly 10 along a cross-section extending diagonally relative to the top view of FIG. 7. The cross-section of FIG. 7B will be utilized for the remaining cross-sectional figures of this disclosure. The cross-section of FIG. 7B does not show the various materials under the conductive posts 58 in order to simplify the drawing.

The cross-section of FIG. 7B shows a configuration which includes a row 68 of the posts 58. Such row has gaps 60 between the posts, with the gaps alternating between first gaps 60a and second gaps 60b. The first gaps have the stack 44 therein, with such stack including the leaker material 46. The second gaps do not have the stack 44 therein. The second gaps 60b are deeper than the first gaps 60a for at least the reason that the second gaps do not have the leaker material 46 (and the remainder of the stack 44) therein.

Figure 8:
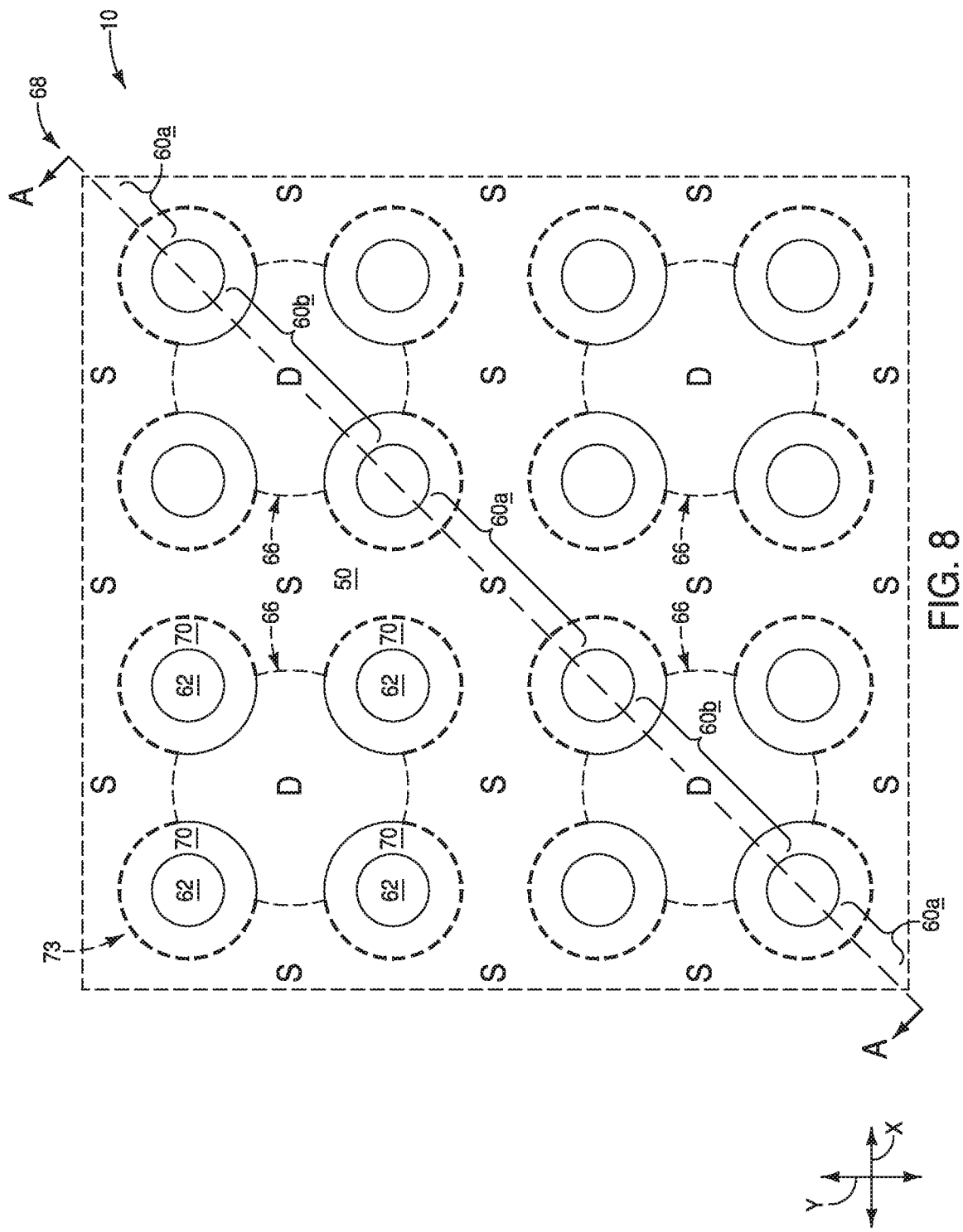
FIGS. 8 and 8A are diagrammatic views of the region of FIGS. 1 and 1A at an example process stage following that of FIGS. 7-7B.
Figure 8A:
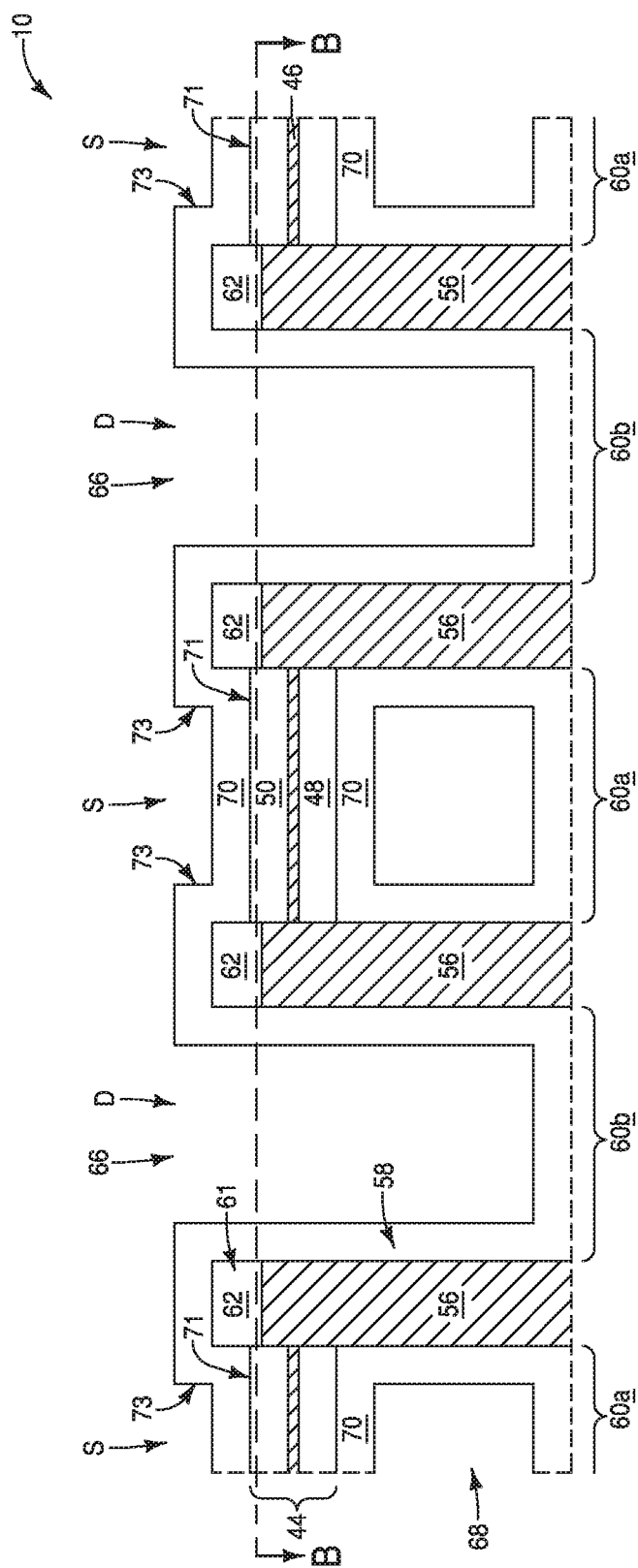

Referring to FIGS. 8 and 8A, insulative-capacitor-material 70 is formed within the first and second gaps 60a and 60b. The insulative-capacitor-material 70 lines the first and second gaps 60a and 60b, and extends along bottom peripheries 71 of the first gaps 60a.

It is noted that the cross-section B-B of FIG. 8A is in a different location than the cross-section B-B of FIGS. 7A and 7B. Specifically, the cross-section B-B of FIG. 8A extends through the insulative caps 64 while the cross-section B-B of FIGS. 7A and 7B extends through the conductive material of the posts 58. The change in elevation of the cross-section B-B is utilized to simplify the view of FIG. 8 so that the locations of the structures 58/62 may be shown with the non-crosshatched designation of the caps 64 rather than with the crosshatched designation of the posts 58. Back sides 73 of the insulative-capacitor-material 70 are shown in dashed-line view in FIG. 8 as such are out of the plane of the view of FIG. 8.

The insulative-capacitor-material 70 may comprise any suitable composition(s). In some embodiments, at least some of the insulative-capacitor-material may comprise ferroelectric insulative material, and in some embodiments an entirety of the insulative-capacitor-material is ferroelectric insulative material.

The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The insulative-capacitor-material 70 may be formed to any suitable thickness; and in some embodiments may have a thickness within a range of from about 30 Å to about 250 Å.

FIGS. 8 and 8A indicate that the gaps 60a may be considered to correspond to shallow regions (S), and that the gaps 60b may be considered to correspond to deep regions (D). Peripheries of the openings 66 are diagrammatically illustrated in FIG. 8 in dashed-line view.

Figure 9:
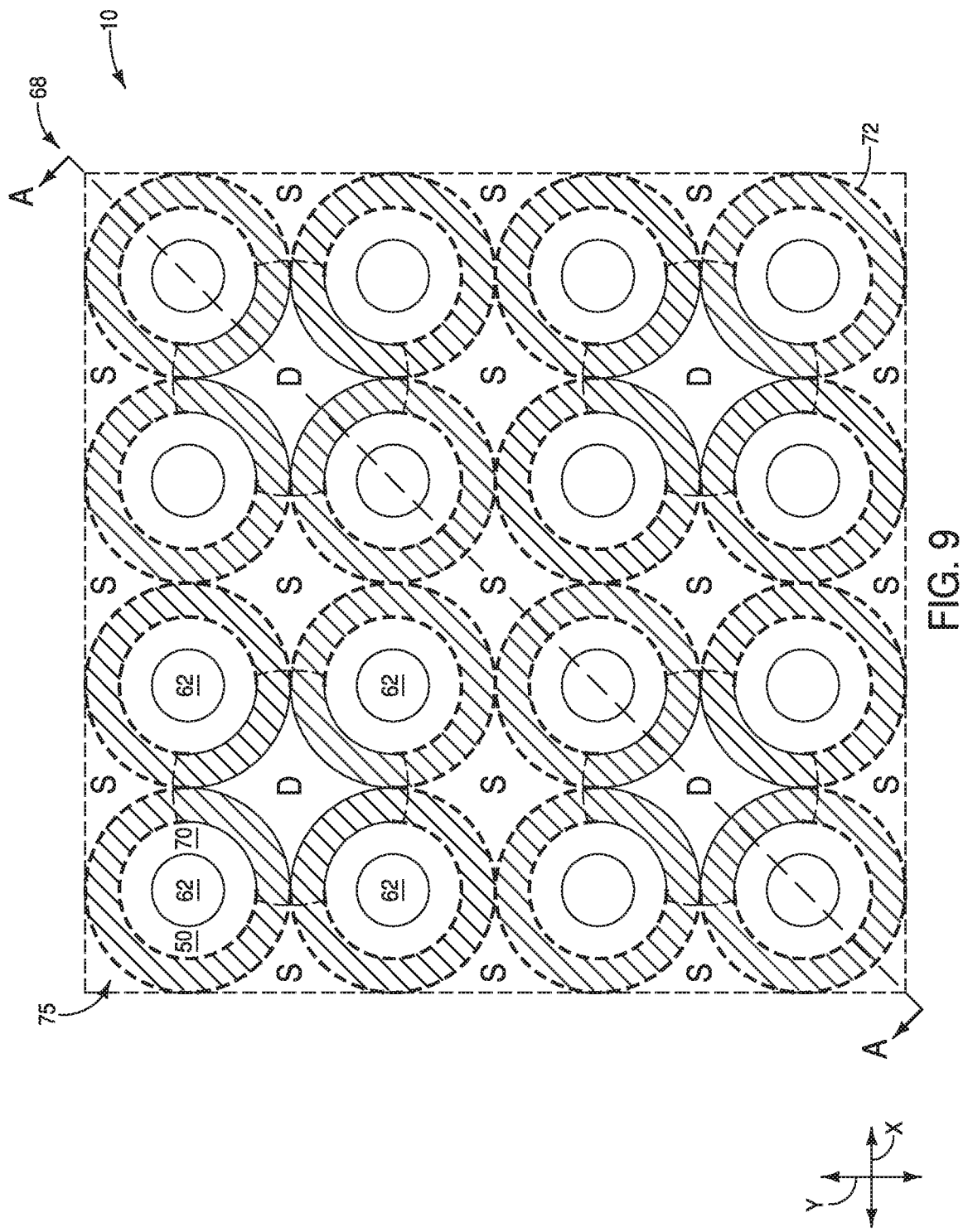
FIGS. 9 and 9A are diagrammatic views of the region of FIGS. 1 and 1A at an example process stage following that of FIGS. 8 and 8A.
Figure 9A:
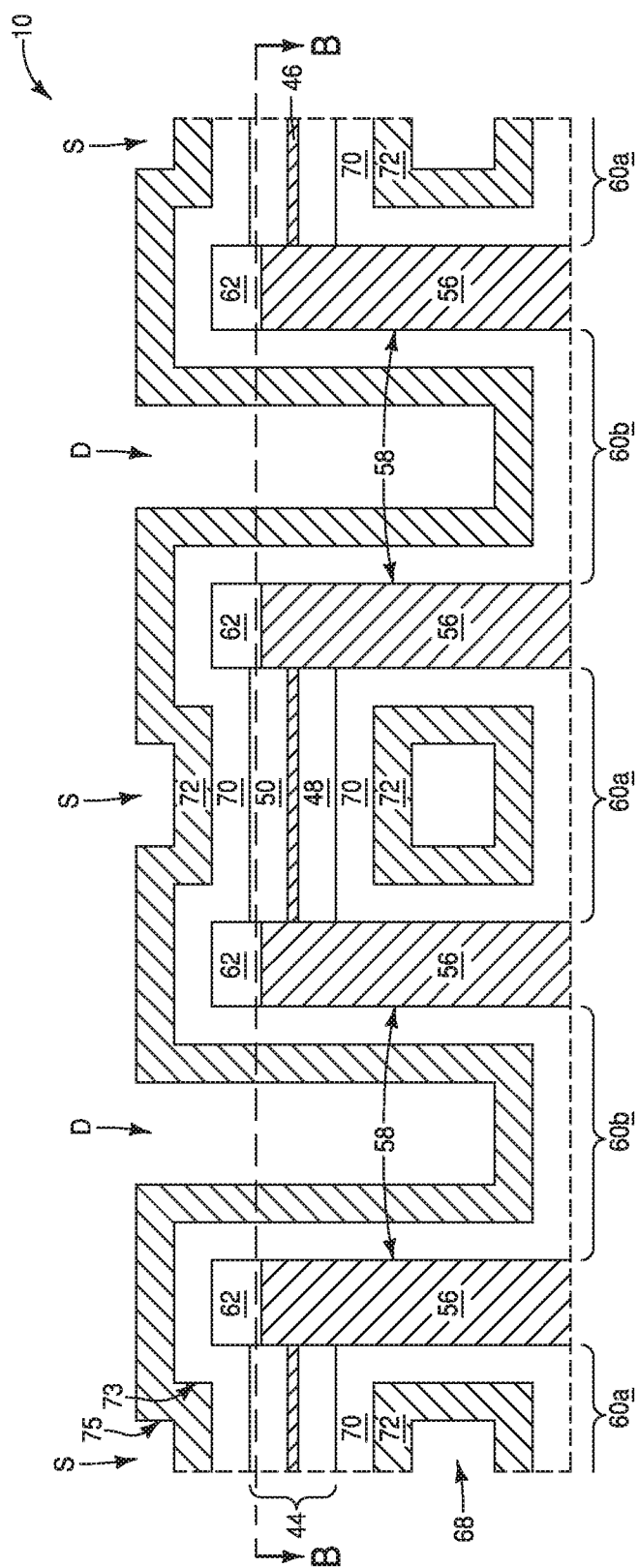

Referring to FIGS. 9 and 9A, conductive material 72 is formed over the posts 58 and within the first and second gaps 60a and 60b. The conductive material 72 is over the insulative-capacitor-material 70. Back sides 75 of the conductive material 72 are shown in dashed-line view in FIG. 9 as such are out of the plane of the view of FIG. 9.

The conductive material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive material 72 may be referred to as a first conductive material to distinguish it from another conductive material formed at a subsequent process stage.

The conductive material 72 is provided to a suitable thickness to close gaps between the studs 58 in the horizontal and vertical directions (with the horizontal and vertical directions being along the x and y axes relative to the top view of FIG. 9), and yet is thin enough to leave the illustrated open spacing in the deep and shallow regions (D and S) along the diagonal direction (with the diagonal direction being relative to the top view of FIG. 9, and being shown along the cross-sectional side view of FIG. 9A).

Figure 10:
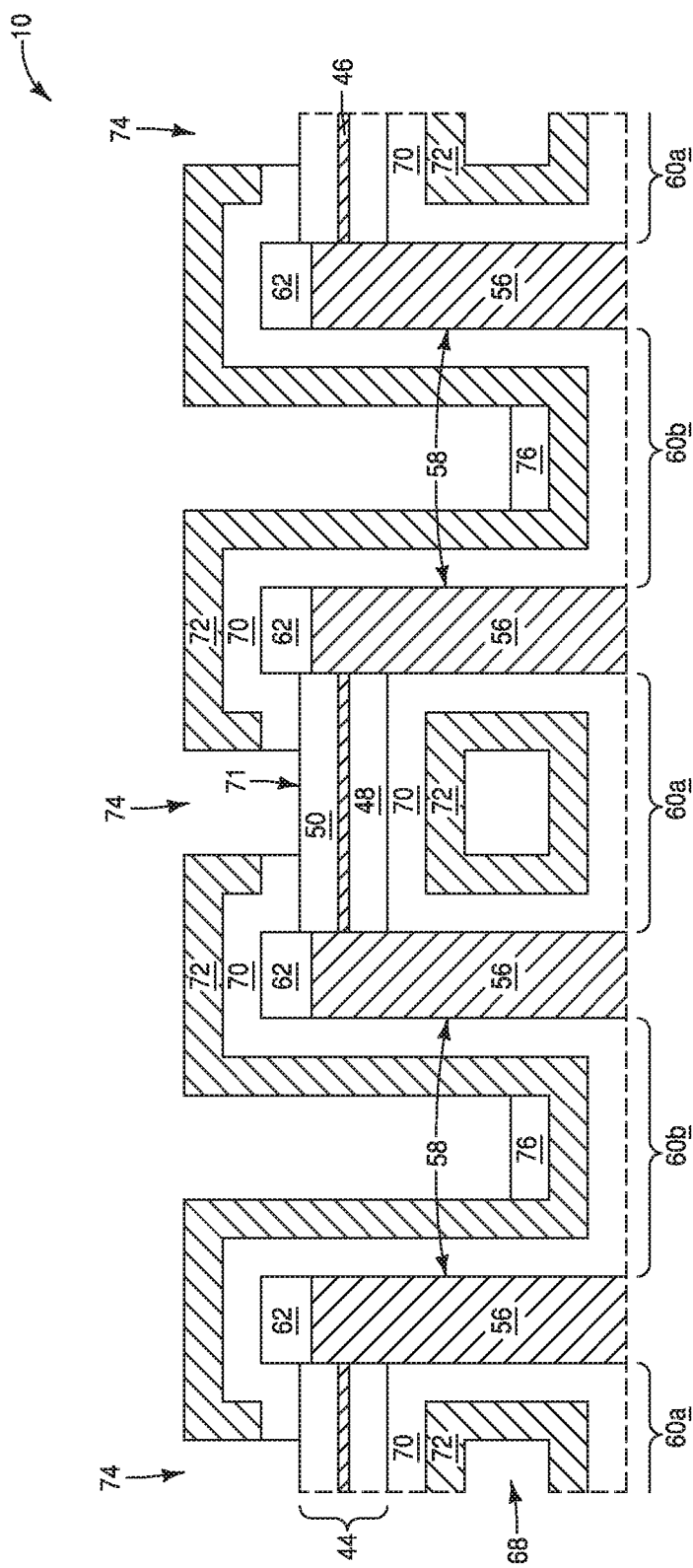
FIGS. 10-12 are cross-sectional side views of the region of FIG. 9A at example sequential process stages following that of FIG. 9A.

Referring to FIG. 10, the assembly 10 is shown at a process stage subsequent to that of FIGS. 9 and 9A, and is shown along the same cross-section as FIG. 9A.

Openings 74 are formed to extend through the first conductive material 72 and the insulative-capacitor-material 70 along the bottom peripheries 71 of the first gaps 60a. In the illustrated embodiment, protective material 76 is provided within the deep second gaps 60b as a precaution to preclude inadvertently etching through the materials within such deep gaps as such etching could problematically lead to punching downwardly to one or more of the structures associated the access devices 12 (FIG. 7A). In some embodiments, the deep gaps 60b may have dimensions such that etchant is substantially precluded from reaching the bottoms of the openings due to geometrical constraints, and in such embodiments the protective material 76 may be omitted.

If the protective material 76 is utilized, such protective material may comprise any suitable composition(s). In some embodiments, the protective material 76 may comprise photoresist, amorphous carbon, etc.

Figure 11:
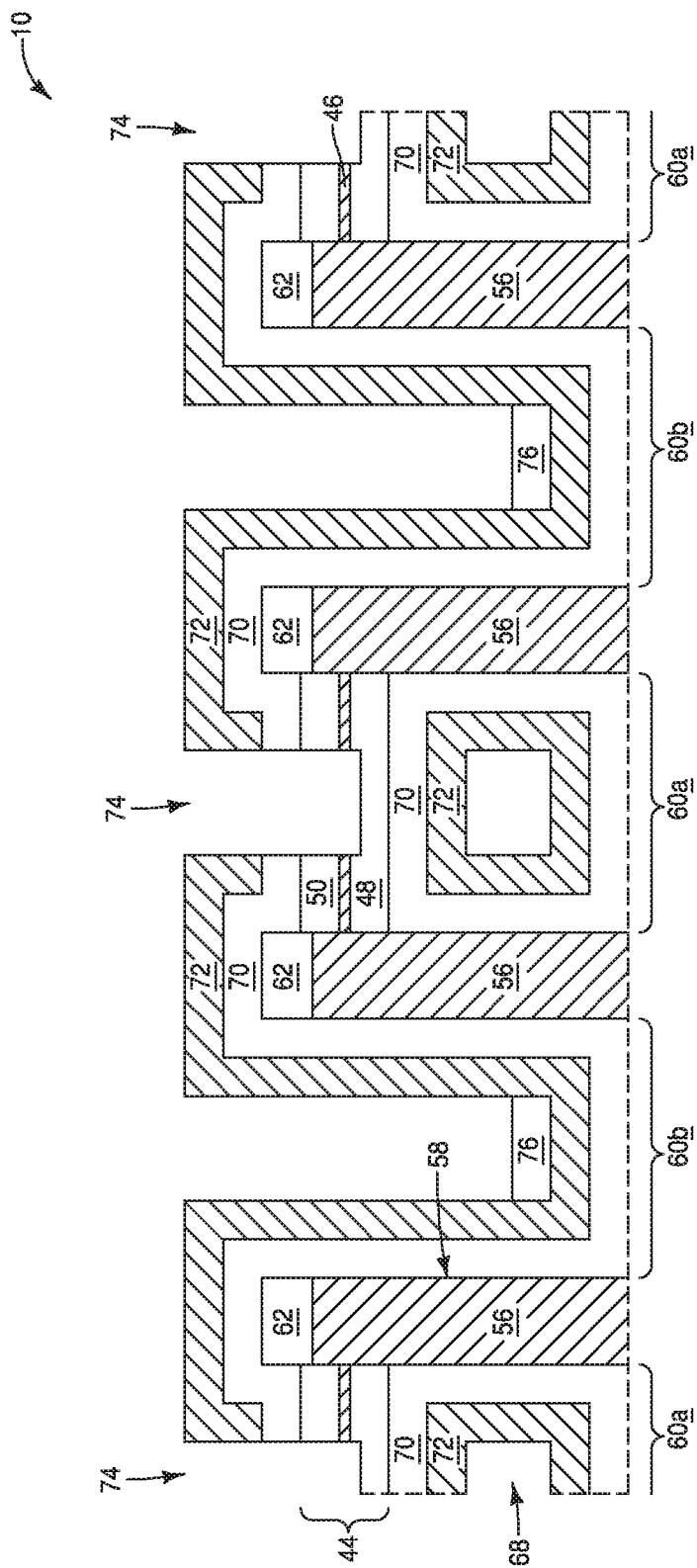

Referring to FIG. 11, the openings 74 are extended through the leaker device material 46. In the illustrated embodiment, the openings 74 stop within the lower dielectric material 48 of the stack 44.

Figure 12:
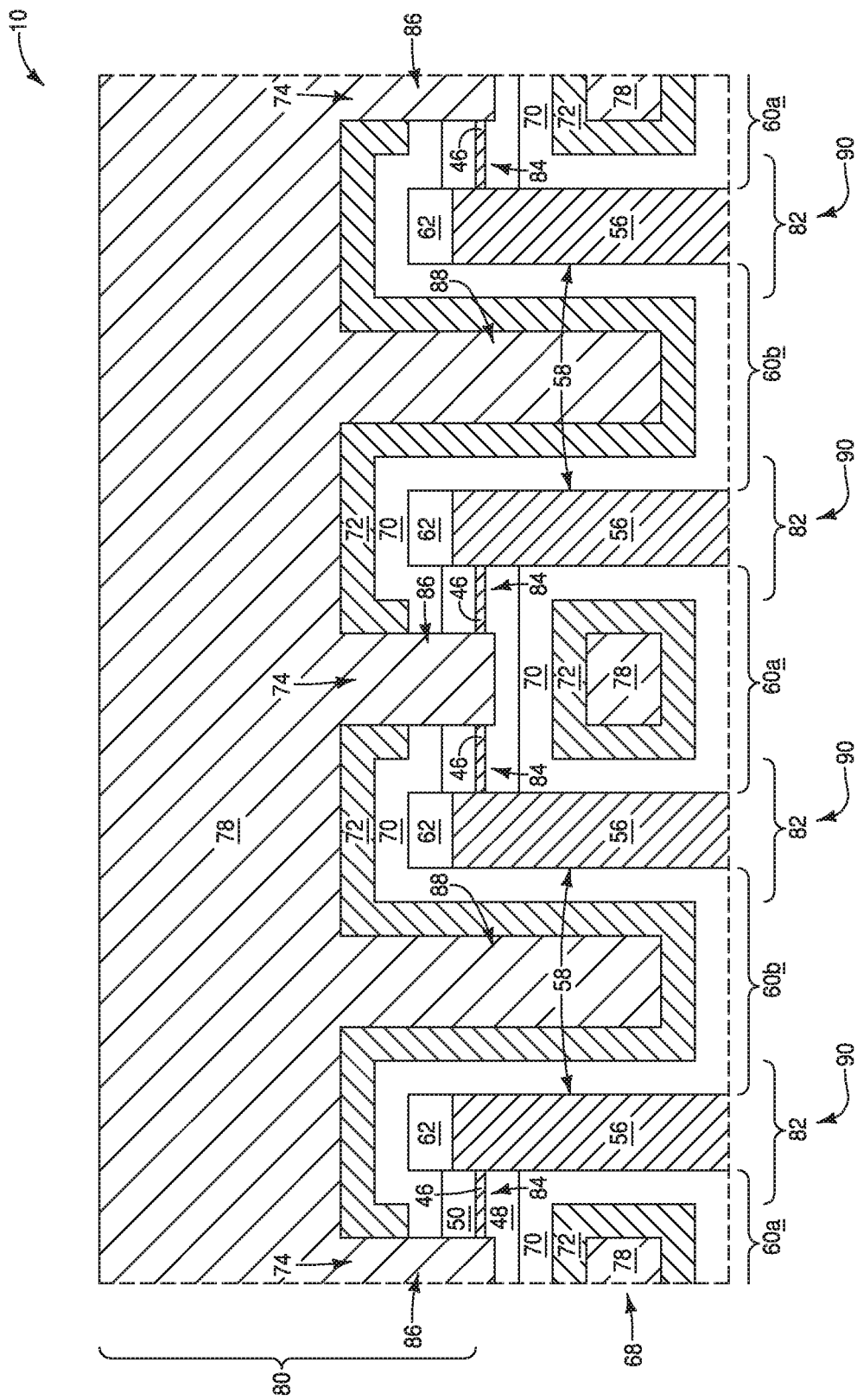

Referring to FIG. 12, second conductive material 78 is formed within the openings 74. The second conductive material 78 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the first and second conductive materials 72 and 78 may comprise a same composition as one another, and in other embodiments they may comprise different compositions relative to one another.

The conductive materials 72 and 78 together form a conductive structure 80. Such conductive structure may correspond to a capacitor electrode, and in some embodiments may be referred to as a second electrode, an upper electrode, or a capacitor plate electrode. The first electrode 58, the second electrode 80, and the insulative-capacitor-material 70 together form capacitors 82. The capacitors and access devices 12 (FIG. 1A) may be together incorporated into memory cells 90 of a memory array, with an example memory array being described below with reference to FIGS. 17 and 18. If the insulative-capacitor-material 70 comprises ferroelectric insulative material, then the capacitors may be ferroelectric capacitors.

The leaker device material 46 of FIG. 12 extends between the upper electrode 80 and the lower electrodes 58, and forms leaker devices 84 which may advantageously prevent build-up of potential at bottom nodes of capacitors associated with individual memory cells.

In some embodiments, regions of the second conductive material 78 within the openings 74 may be considered to be configured as downward projections 86. Such downward projections 86 are portions of the conductive structure 80. The leaker devices 84 directly contact the downward projections 86.

The embodiment of FIG. 12 shows the posts 58 arranged in the row 68, with such row having the alternating gaps 60a and 60b. The leaker devices 84 are within the gaps 60a, and are not within the gaps 60b. The conductive structure 80 has deep downward projections 88 within the deep gaps 60b, and has the downward projections 86 as shallow downward projections within the shallow gaps 60a. The leaker devices 84 extend from sidewalls of the shallow downward projections 86 to sidewalls of neighboring posts 58.

In some embodiments, the leaker devices 84 may be considered to be resistive interconnects coupling bottom electrodes 58 to the conductive plate structure 80 within individual capacitors 82. The capacitors 82 are comprised by the memory cells 90. If the leaker devices 84 are too leaky, then one or more memory cells 90 may experience cell-to-cell disturb. If the leaker devices 84 are not leaky (conductive) enough, then excess charge from the bottom electrodes 58 will not be drained. Persons of ordinary skill in the art will recognize how to calculate the resistance needed for the leaker devices 84 for a given memory array. In some embodiments, the leaker devices 84 may have resistance within a range of from about 0.1 megaohms to about 5 megaohms. Factors such as separation between adjacent memory cells, physical dimensions of the memory cells, the amount of charge placed in the memory cells, a size of the memory array, a frequency of operations conducted by the memory array, etc., may be considered when making a determination of the resistance appropriate for the leaker devices 84.

Figure 13:
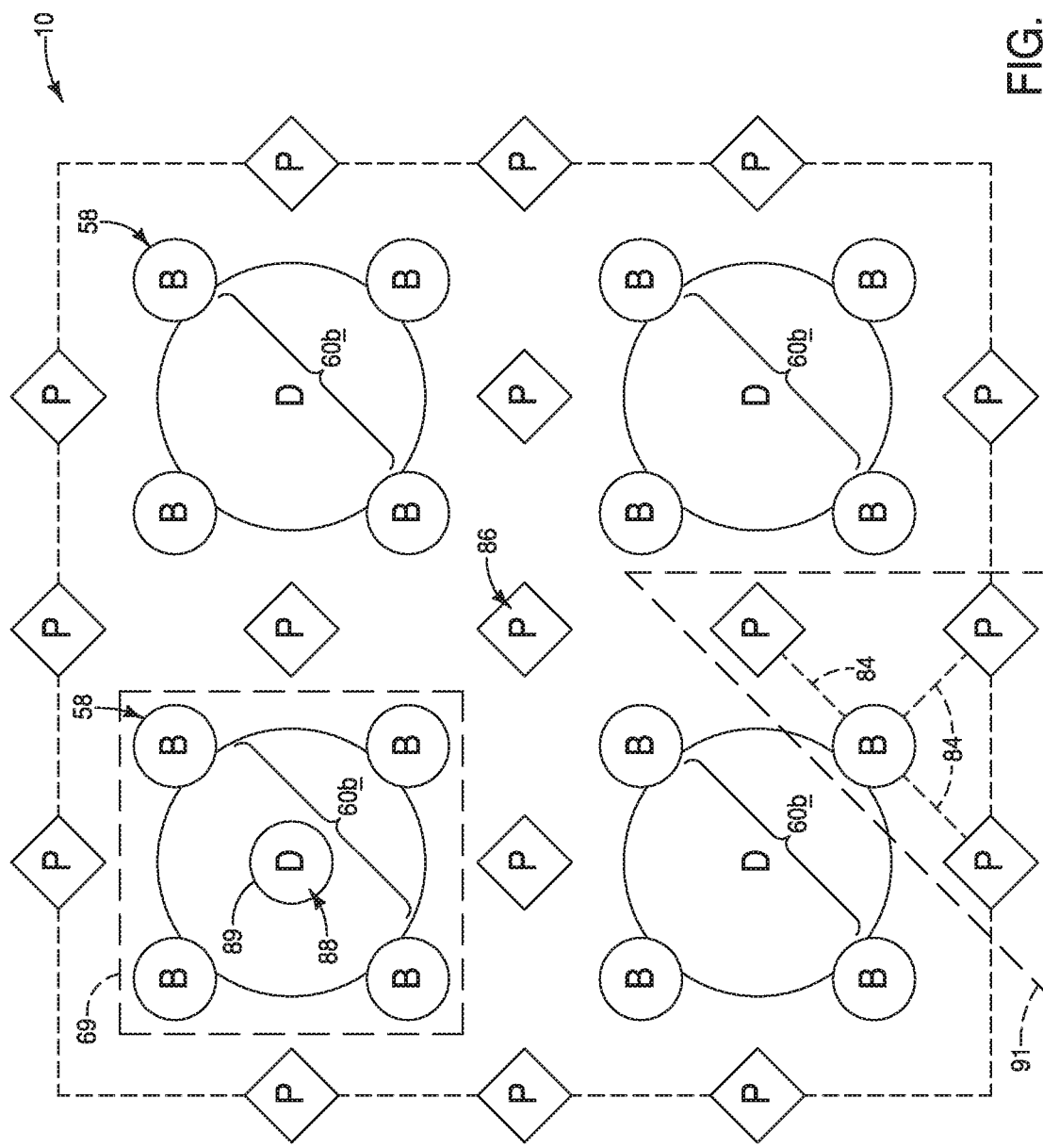
FIG. 13 is a diagrammatic top-down view of a region of an example assembly formed with the processing of FIGS. 1-12.
Figure 13:
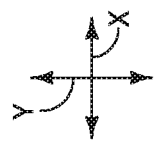

FIG. 13 is a diagrammatic top-down view of a region of the integrated assembly 12. FIG. 13 shows the symbol D of FIGS. 8 and 9 to diagrammatically indicate regions of the deep gaps 60b. The posts 58 are labeled B to indicate that they are bottom electrodes. The shallow projections 86 are labeled P to indicate that they part of the plate electrode 80.

The posts 58 (B) are arranged in the sets of four described above with reference to FIG. 6, with one of such sets of four being within the dashed-line box 69 of FIG. 13. Each of the sets of four posts 58 has a central region 89 (designated with a circle centrally located within the box 69). The central region 89 is approximately equidistant from each of the four posts 58 within a set. The downward projections 88 are approximately (substantially) vertically aligned with the central regions 89, as is diagrammatically indicated relative to the region within the box 69 of FIG. 13.

In some embodiments, each of the bottom electrodes 58 (B) may be considered to be neighboring to three of the downward projections 86 (P), with an example of such neighboring relationship being shown within a triangular region 91. The leaker devices 84 extend between the bottom electrodes (B) and the neighboring downward projections (P) as is diagrammatically illustrated within the triangular region 91. The leaker devices 84 may enable excess charge to be drained from the bottom electrodes (B) to the neighboring downward projections (P).

The illustrated embodiment of FIG. 12 has the leaker devices 84 along upper regions of the conductive posts 58, and has the insulative material 70 extending over the conductive posts 58. In other embodiments, the insulative material 70 may not extend over the conductive posts 58 and/or the leaker devices 84 may be formed along lower regions of the conductive posts 58. An example of such other embodiments is described with reference to FIGS. 14-16.

Figure 14:
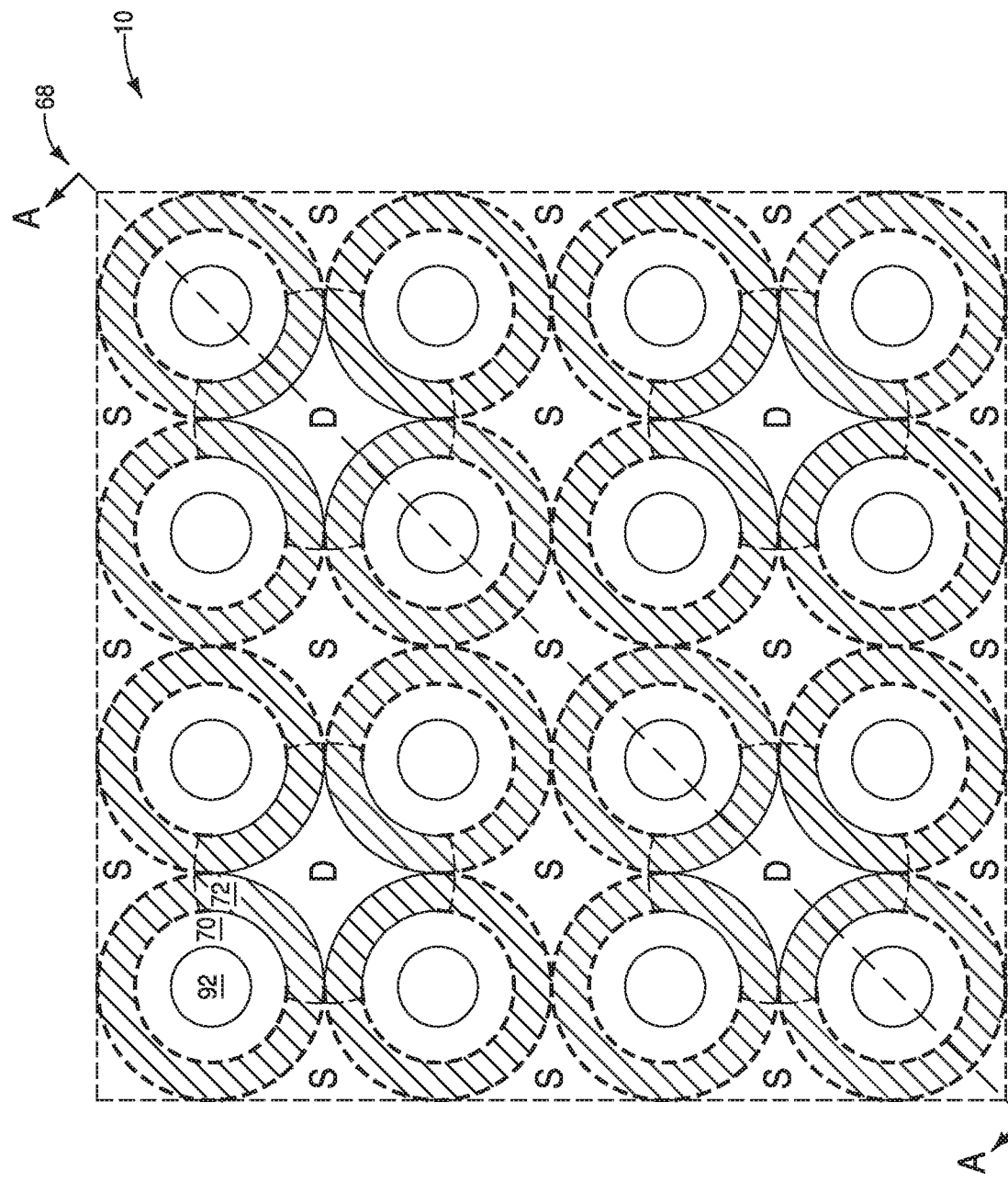
FIGS. 14 and 14A are diagrammatic views of a region of an example assembly.
Figure 14A:
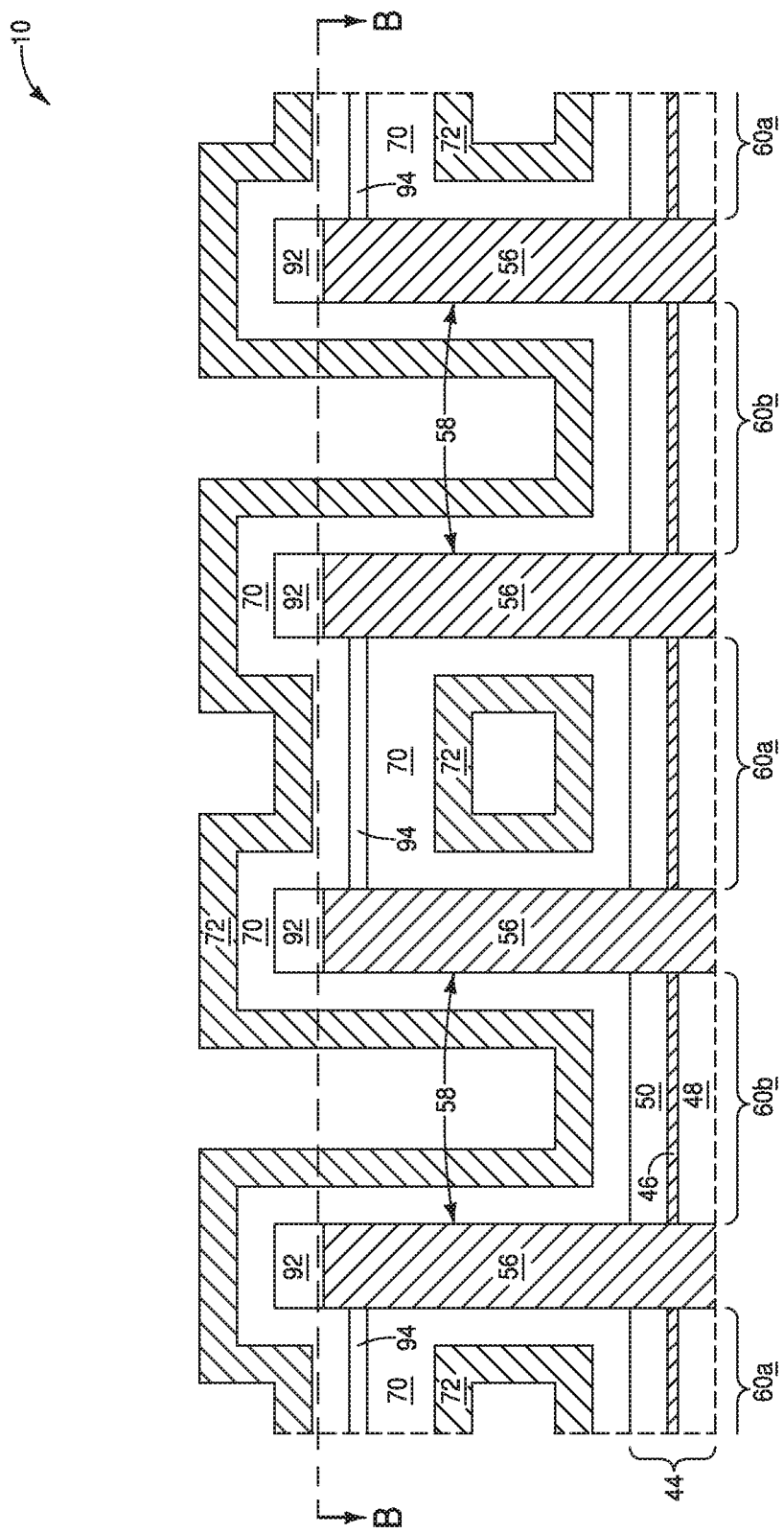

Referring to FIGS. 14 and 14A, the assembly 10 is shown in a configuration in which the stack 44 of the dielectric materials 48 and 50, and leaker device material 46, is formed along bottom regions of the conductive posts 58.

Insulative material 92 is over the conductive posts 56. The insulative material 92 may comprise the same composition as the insulative material 62 of FIG. 12, or may comprise a different composition. In some embodiments, the insulative material 92 may comprise carbon-doped silicon dioxide.

Insulative lattice material 94 extends between the conductive posts 58 within the gaps 60a. The lattice material 94 may comprise any suitable composition(s), and in some embodiments may comprise, consist essentially of, or consist of silicon nitride.

The insulative-capacitor-material 70 is along sidewalls of the conductive posts 58, and the first conductive material 72 is over the insulative-capacitor-material 70.

Figure 15:
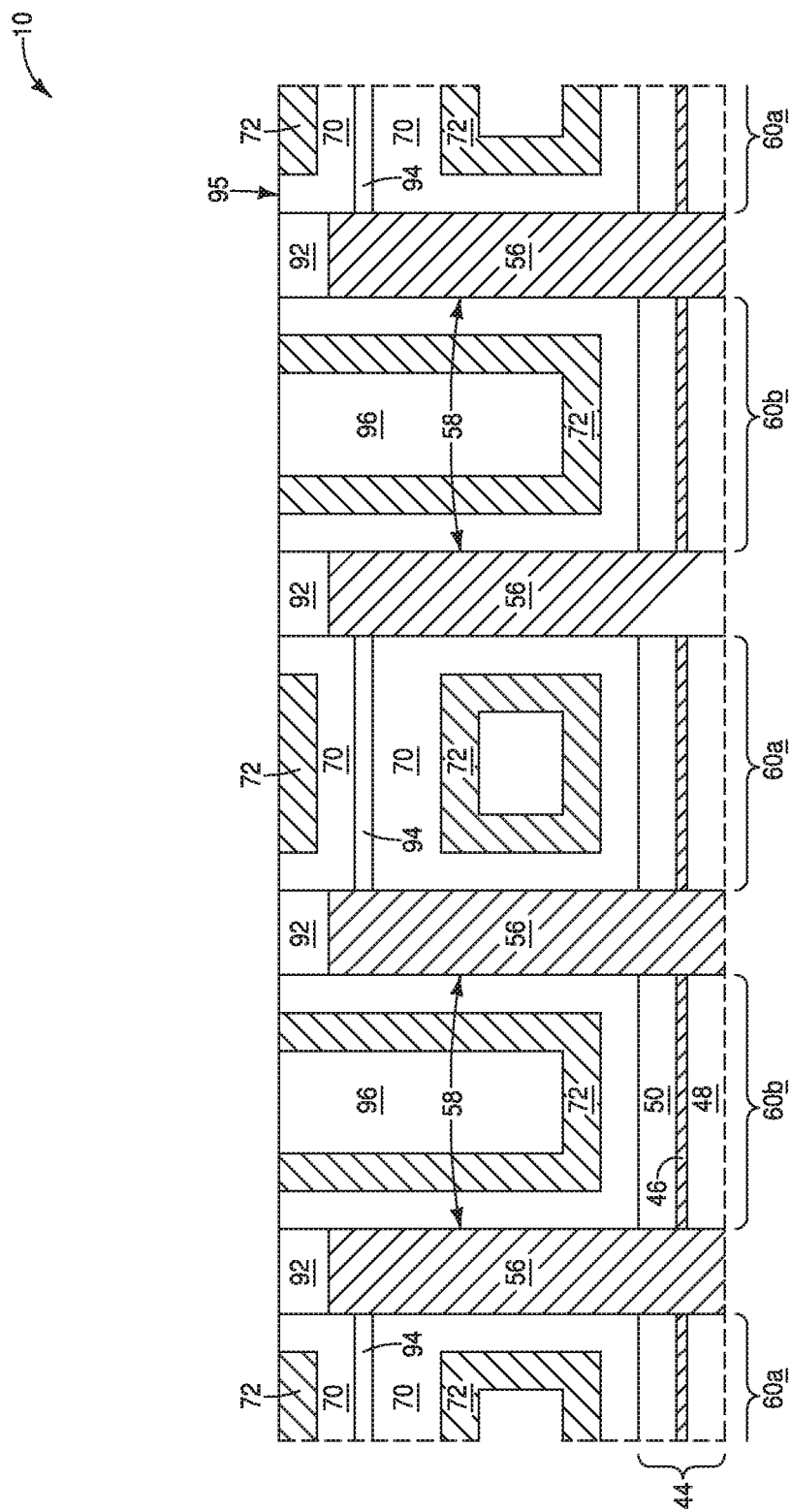
FIGS. 15 and 16 are cross-sectional side views of the region of FIG. 14A at example sequential process stages following that of FIG. 14A.

FIG. 15 shows a view along the same cross-section as FIG. 14A at a processing stage subsequent to that of FIG. 14. Insulative material 96 is formed within the gaps 60b, and a planarized surface 95 is formed to extend across the materials 70, 72, 92 and 96. The planarized surface 95 may be formed with any suitable processing, including, for example, CMP.

Figure 16:
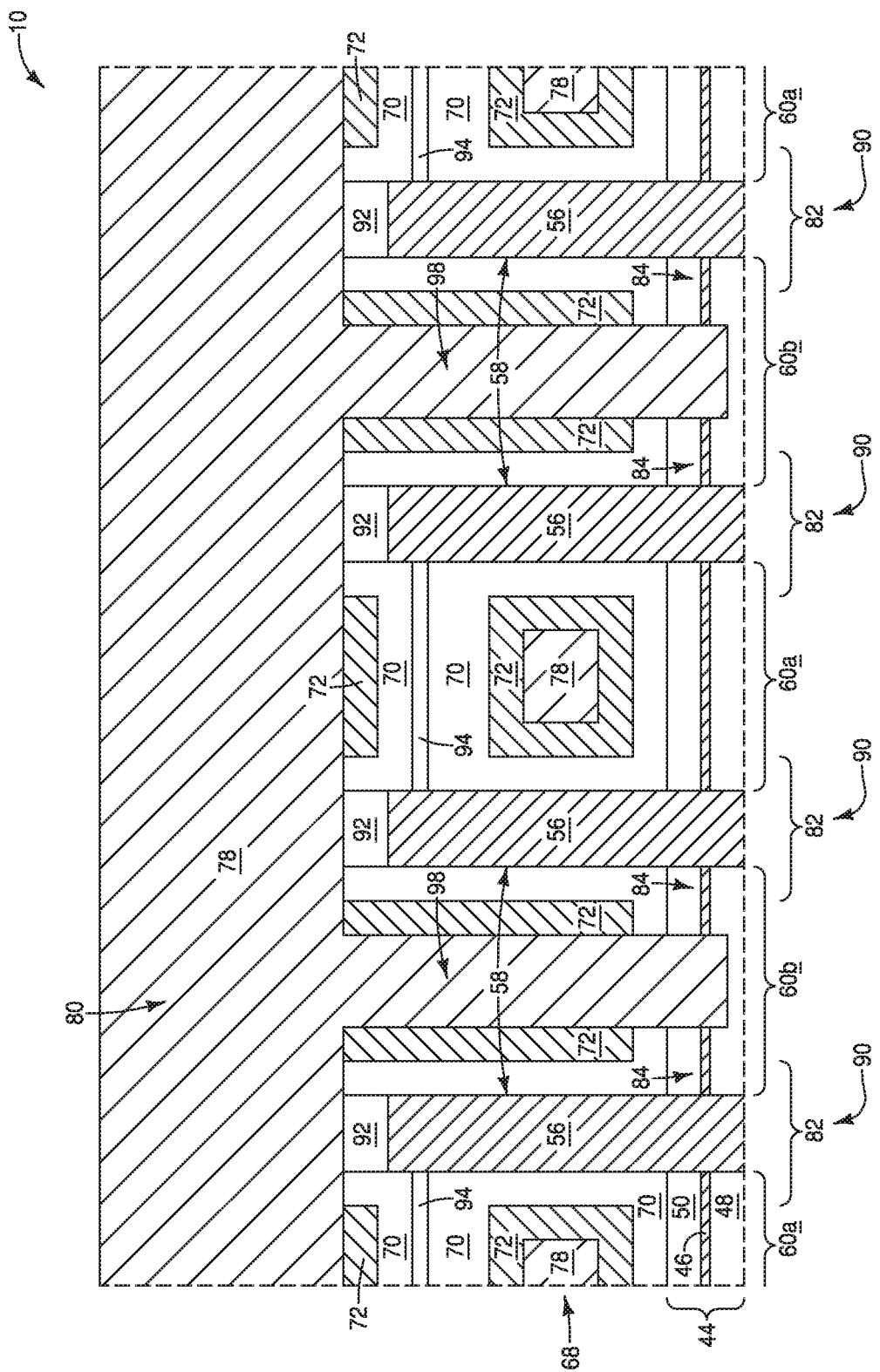

Referring to FIG. 16, the second conductive material 78 is formed over the planarized surface 95, and is formed to have projections 98 extending through the leaker material 46 within the gaps 60b. The leaker material within the gaps 60b is thus configured as leaker devices 84, with such leaker devices being along lower regions of the first electrodes 58.

The conductive materials 72 and 78 together form an upper electrode structure 80 analogous to the structure 80 described above with reference to FIG. 12.

The embodiment of FIG. 16 does not have the insulative-capacitor-material 70 over the conductive posts (bottom electrodes) 58, in contrast to the embodiment described above with reference to FIG. 12.

The electrodes 58 and 80 of FIG. 16 may form capacitors 82 analogous to those described above with reference to FIG. 12, and such capacitors may be incorporated into memory cells 90.

The memory cells 90 of FIGS. 12 and 16 include access devices 12 (FIG. 1A) in combination with the capacitors 82 (which may be ferroelectric capacitors). An example memory cell 90 is schematically illustrated in FIG. 17, with such memory cell including an access device 12 configured as a transistor. The memory cell 90 is shown coupled with a wordline 100 and a digit line 102. Also, one of the electrodes of the ferroelectric capacitor 82 is shown coupled with a plate line 104. The plate line may be utilized in combination with the wordline 100 for controlling an operational state of the ferroelectric capacitor 82.

The memory arrays described above may be ferroelectric memory arrays, and may have any suitable configuration. An example ferroelectric memory array (FeRAM array) 106 is described with reference to FIG. 18. The memory array includes a plurality of substantially identical ferroelectric capacitors 82 (with the term "substantially identical" meaning identical to within reasonable tolerances of fabrication and measurement). Wordlines (first linear structures) 100 extend along rows of the memory array, and digit lines (second linear structures) 102 extend along columns of the memory array. Each of the capacitors 82 is within a memory cell 90 which is uniquely addressed utilizing a combination of a wordline and a digit line. The wordlines 100 extend to driver circuitry (wordline-driver-circuitry) 110, and the digit lines 102 extend to sensing circuitry (sense-amplifier-circuitry) 112. The plate lines 104 extend to a suitable reference source 114 or driver (in some applications, the plate "lines" may actually be a large expanse of conductive material extending across all of the capacitors rather than being individual lines).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation. The drawings are for diagrammatic purposes only, and are not to scale.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a row of vertically-extending conductive posts. The conductive posts are spaced from one another by gaps. Leaker device material is within at least some of the gaps. An insulative material is along sidewalls of the conductive posts. A conductive structure is over the conductive posts. The conductive structure has downward projections extending into at least some of the gaps. The leaker device material is configured as horizontally-extending segments along sides of the downward projections and extending from the sides to one or more of the conductive posts.

Some embodiments include an integrated assembly comprising a row of conductive posts. The conductive posts are spaced from one another by gaps. The gaps alternate between first gaps and second gaps. The first gaps have leaker device material extending between neighboring posts and the second gaps do not having the leaker device material therein. An insulative material is along sidewalls of the conductive posts. A conductive structure is over the conductive posts and has first and second downward projections extending into the first and second gaps, respectively. The first downward projections extend through the leaker device material and are directly against the leaker device material. The second downward projections extend further than the first downward projections to be deeper than the first downward projections.

Some embodiments include a method of forming an integrated assembly. Conductive posts are formed over access devices. The conductive posts are spaced from one another by gaps. Leaker device material is within the gaps and contacts sidewalls of the posts. Segments of the leaker device material are removed to form a configuration having a row of the posts along a cross-section. The row has the gaps between the posts, with the gaps alternating between first gaps and second gaps. The first gaps have the leaker device material therein, and the second gaps do not have the leaker device material therein. The second gaps are deeper than the first gaps due to at least the leaker device material. Insulative-capacitor-material is formed within the first and second gaps and along sidewalls of the posts. The insulative-capacitor-material lines the first and second gaps and extends along bottom peripheries of the first gaps. First conductive material is formed over the posts and within the first and second gaps. The first conductive material is over the insulative-capacitor-material. Openings are formed to extend through the first conductive material and the insulative-capacitor-material along the bottom peripheries of the first gaps. The openings penetrate through the leaker device material. The openings are filled with second conductive material. The first and second conductive materials together form a conductive structure. The second conductive material within the openings is configured as downward projections of the conductive structure. The leaker device material extends from the downward projections of the conductive structure to neighboring conductive posts and directly contacts the conductive structure and the neighboring conductive posts. The conductive structure, insulative-capacitor-material and conductive posts together form a plurality of capacitors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a row of vertically-extending conductive posts; the conductive posts being spaced from one another by gaps; leaker device material being within at least some of the gaps;
   an insulative material along sidewalls of the conductive posts; and
   a conductive structure over the conductive posts; the conductive structure having downward projections extending into at least some of the gaps; the leaker device material being configured as horizontally-extending segments along sides of the downward projections and extending from said sides to one or more of the conductive posts.

2. The integrated assembly of claim 1 wherein the leaker device material is along upper regions of the conductive posts.

3. The integrated assembly of claim 1 wherein the leaker device material is along lower regions of the conductive posts.

4. The integrated assembly of claim 1 wherein the insulative material is over the conductive posts.

5. The integrated assembly of claim 1 wherein the insulative material is not over the conductive posts.

6. The integrated assembly of claim 1 wherein the insulative material is ferroelectric insulative material.

7. The integrated assembly of claim 1 wherein the leaker device material comprises one or more of Ti, Ni and Nb, in combination with one or more of Ge, Si, O, N and C.

8. The integrated assembly of claim 1 wherein the leaker device material comprises one or more of Si, Ge, SiN, TiSiN, TiO, TiN, NiO, NiON and TiON; where the chemical formulas indicate primary constituents rather than particular stoichiometries.

9. The integrated assembly of claim 1 wherein the leaker device material comprises titanium, oxygen and nitrogen.

10. The integrated assembly of claim 1 wherein the leaker device material is vertically sandwiched between a lower dielectric material and an upper dielectric material.

11. The integrated assembly of claim 1 wherein the upper and lower dielectric materials are different compositions relative to one another.

12. The integrated assembly of claim 1 wherein the upper and lower dielectric materials are a same composition as one another.

13. The integrated assembly of claim 12 wherein the upper and lower dielectric materials comprise silicon nitride.

14. The integrated assembly of claim 1 wherein the conductive posts are coupled with access devices, and wherein the access devices are under the conductive posts.

15. The integrated assembly of claim 1 wherein the conductive posts, conductive structure and insulative material are together configured as capacitors of a memory array.

16. The integrated assembly of claim 15 wherein the capacitors are ferroelectric capacitors.

17. An integrated assembly, comprising:
   a row of conductive posts; the conductive posts being spaced from one another by gaps; the gaps alternating between first gaps and second gaps; the first gaps having leaker device material extending between neighboring posts and the second gaps not having the leaker device material therein;
   an insulative material along sidewalls of the conductive posts; and
   a conductive structure over the conductive posts and having first and second downward projections extending into the first and second gaps, respectively; the first downward projections extending through the leaker device material and being directly against the leaker device material; the second downward projections extending further than the first downward projections to be deeper than the first downward projections.

18. The integrated assembly of claim 17 wherein each of the posts is neighboring to three of the first downward projections.

19. The integrated assembly of claim 18 wherein:
   the posts are arranged in sets of four from top-down view;
   each of the sets has a central region which is approximately equidistant from the four posts of the set; and
   the second downward projections are substantially vertically aligned with the central regions.

20. The integrated assembly of claim 17 wherein the leaker device material is vertically sandwiched between a lower dielectric material and an upper dielectric material.

21. The integrated assembly of claim 17 wherein the upper and lower dielectric materials are different compositions relative to one another.

22. The integrated assembly of claim 17 wherein the upper and lower dielectric materials are a same composition as one another.

23. The integrated assembly of claim 22 wherein the upper and lower dielectric materials comprise silicon nitride.

24. The integrated assembly of claim 17 wherein the insulative material is ferroelectric insulative material.

25. The integrated assembly of claim 24 wherein the ferroelectric insulative material includes one or more of zirconium, zirconium oxide, niobium, niobium oxide, hafnium, hafnium oxide, lead zirconium titanate, and barium strontium titanate.

26. The integrated assembly of claim 25 wherein the ferroelectric insulative material further includes one or more of one or more of silicon, aluminum, lanthanum, yttrium, erbium, calcium, magnesium and strontium.

27. The integrated assembly of claim 17 wherein the leaker device material comprises one or more of Ti, Ni and Nb, in combination with one or more of Ge, Si, O, N and C.

28. The integrated assembly of claim 17 wherein the leaker device material comprises one or more of Si, Ge, SiN, TiSiN, TiO, TiN, NiO, NiON and TiON; where the chemical formulas indicate primary constituents rather than particular stoichiometries.

29. The integrated assembly of claim 17 wherein the leaker device material comprises titanium, oxygen and nitrogen.

30. The integrated assembly of claim 17 wherein the leaker device material comprises a thickness within a range of from about 2 Å to about 20 Å.

31. The integrated assembly of claim 17 wherein the leaker device material comprises a thickness within a range of from about 6 Å to about 15 Å.

32. A method of forming an integrated assembly, comprising:
 forming conductive posts over access devices; the conductive posts being spaced from one another by gaps; leaker device material being within the gaps and contacting sidewalls of the posts;
 removing segments of the leaker device material to form a configuration having a row of the posts along a cross-section; the row having the gaps between the posts with the gaps alternating between first gaps and second gaps; the first gaps having the leaker device material therein, and the second gaps not having the leaker device material therein; the second gaps being deeper than the first gaps due to at least the leaker device material within the first gaps;
 forming insulative-capacitor-material within the first and second gaps and along the sidewalls of the posts; the insulative-capacitor-material lining the first and second gaps and extending along bottom peripheries of the first gaps;
 forming first conductive material over the posts and within the first and second gaps; the first conductive material being over the insulative-capacitor-material;
 forming openings to extend through the first conductive material and the insulative-capacitor-material along the bottom peripheries of the first gaps, the openings penetrating through the leaker device material; and
 filling the openings with second conductive material; the first and second conductive materials together forming a conductive structure; the second conductive material within the openings being configured as downward projections of the conductive structure; the leaker device material extending from the downward projections of the conductive structure to neighboring conductive posts and directly contacting the conductive structure and the neighboring conductive posts; the conductive structure, insulative-capacitor-material and conductive posts together forming a plurality of capacitors.

33. The method of claim 32 further comprising forming insulative caps over the conductive posts prior to forming the insulative-capacitor-material.

34. The method of claim 33 wherein the insulative caps comprise one or both of silicon and carbon.

35. The method of claim 32 wherein the leaker device material is sandwiched between first and second dielectric materials.

36. The method of claim 35 wherein the first and second dielectric materials comprise silicon nitride.

37. The method of claim 32 wherein the insulative-capacitor-material is a ferroelectric insulative material.

38. The method of claim 32 wherein the first and second conductive materials comprise a same composition as one another.

39. The method of claim 32 wherein the first and second conductive materials comprise different compositions relative to one another.

40. The method of claim 32 wherein the access devices are vertically-extending transistors.

* * * * *